(12) United States Patent
Shin et al.

(10) Patent No.: US 11,424,186 B2
(45) Date of Patent: Aug. 23, 2022

(54) SEMICONDUCTOR MEMORY DEVICE AND APPARATUS INCLUDING THE SAME

(71) Applicants: Samsung Electronics Co., Ltd., Suwon-si (KR); UNIST (ULSAN NATIONAL INSTITUTE OF SCIENCE AND TECHNOLOGY), Ulsan (KR)

(72) Inventors: Hyeonjin Shin, Suwon-si (KR); Minhyun Lee, Suwon-si (KR); Changseok Lee, Gwacheon-si (KR); Kyung-Eun Byun, Seongnam-si (KR); Hyeonsuk Shin, Ulsan (KR); Seokmo Hong, Ulsan (KR)

(73) Assignees: Samsung Electronics Co., Ltd., Gyeonggi-do (KR); UNIST (Ulsan National Institute of Science and Technology), Ulsan (KR)

( * ) Notice: Subject to any disclaimer, the term of this patent is extended or adjusted under 35 U.S.C. 154(b) by 0 days.

(21) Appl. No.: 17/082,530

(22) Filed: Oct. 28, 2020

(65) Prior Publication Data
US 2021/0125930 A1    Apr. 29, 2021

(30) Foreign Application Priority Data
May 6, 2020   (KR) .................. 10-2020-0054106

(51) Int. Cl.
*H01L 23/532*   (2006.01)
*H01L 23/522*   (2006.01)
*H01L 27/108*   (2006.01)

(52) U.S. Cl.
CPC ...... *H01L 23/5329* (2013.01); *H01L 23/5226* (2013.01); *H01L 27/10805* (2013.01)

(58) Field of Classification Search
CPC ............ H01L 23/5226; H01L 23/5329; H01L 27/10805; H01L 45/1233; H01L 24/83
See application file for complete search history.

(56) References Cited

U.S. PATENT DOCUMENTS

| | | | |
|---|---|---|---|
| 6,727,539 B2 | 4/2004 | Divakaruni et al. | |
| 8,148,269 B2 | 4/2012 | Balseanu et al. | |
| (Continued) | | | |

FOREIGN PATENT DOCUMENTS

| | | |
|---|---|---|
| KR | 20040012972 A | 2/2004 |
| KR | 100620458 B1 | 9/2006 |
| (Continued) | | |

OTHER PUBLICATIONS

Extended European Search Report dated Mar. 12, 2021, issued in corresponding European Patent Application No. 20204602.5.
(Continued)

*Primary Examiner* — Jaehwan Oh
*Assistant Examiner* — John M Parker
(74) *Attorney, Agent, or Firm* — Harness, Dickey & Pierce, P.L.C.

(57) ABSTRACT

A semiconductor memory device and a device including the same are provided. The semiconductor memory device includes word lines extending in a first direction on a semiconductor substrate; bit line structures extending across the word lines in a second direction crossing the first direction; contact pad structures between the word lines and
(Continued)

between the bit line structures; and spacers between the bit line structures and the contact pad structures. The spacers include a boron nitride layer.

18 Claims, 36 Drawing Sheets

(56) References Cited

U.S. PATENT DOCUMENTS

| | | | |
|---|---|---|---|
| 9,312,210 | B2 | 4/2016 | Lee et al. |
| 10,418,374 | B2 | 9/2019 | Lee et al. |
| 2004/0083973 | A1 | 5/2004 | Sakamoto et al. |
| 2004/0164328 | A1* | 8/2004 | Lee .................. H01L 27/10855 257/213 |
| 2007/0082492 | A1 | 4/2007 | Kim et al. |
| 2010/0285662 | A1* | 11/2010 | Kim .................. H01L 21/76831 438/675 |
| 2013/0320549 | A1* | 12/2013 | Lee .................. H01L 27/10855 257/773 |
| 2019/0296024 | A1 | 9/2019 | Ji et al. |
| 2020/0051921 | A1 | 2/2020 | Lee et al. |
| 2021/0123161 | A1 | 4/2021 | Lee et al. |

FOREIGN PATENT DOCUMENTS

| | | |
|---|---|---|
| KR | 100801736 B1 | 2/2008 |
| KR | 20170134039 A | 12/2017 |
| KR | 101983219 B1 | 5/2019 |
| KR | 2021-0052162 A | 5/2021 |

OTHER PUBLICATIONS

Jun Liu et al., 'Plasma deposition of low dielectric constant (k=2.2—2.4) Boron Nitride on methylsilsesquioxane-based nanoporous films' *Journal of Applied Physics*, vol. 96, No. 11, Dec. 2004, pp. 6679-6684.

Extended European Search Report dated Mar. 19, 2021, issued in corresponding European Patent Application No. 20204299.0.

Lei Li and Xiang Ming Chen, 'On the measured dielectric constant of amorphous boron nitride' *Nature*, vol. 590, No. 7844, Feb. 2021, pp. E6-E7.

S. V. Nguyen et al., 'Plasma-Assisted Chemical Vapor Deposition and Characterization of Boron Nitride Films' *Journal of the Electrochemical Society*, vol. 141, No. 6, Jun. 1994, pp. 1633-1638.

* cited by examiner

| Samples | B (at%) | N (at%) | H (at%) |
|---|---|---|---|
| a-BN | 47.6 | 46.9 | 5.5 |

| Electrical properties | | Film properties | |
|---|---|---|---|
| Dielectric constant @100 kHz / @1 MHz | Breakdown Field (MV-cm$^{-1}$) | Refractive index (n) @ 633 nm | Density (g-cm$^{-3}$) |
| h-BN  3.28 / 2.87 | 2.2 | 2.16 | 2.1 |
| a-BN  1.78 / 1.16 | 7.3 | 1.37 | 2.1~2.3 |

SEMICONDUCTOR MEMORY DEVICE AND APPARATUS INCLUDING THE SAME

CROSS-REFERENCE TO RELATED APPLICATIONS

This application claims the benefit of Korean Patent Application Nos. 10-2019-0135755 and 10-2020-0054106, filed on Oct. 29, 2019 and May 6, 2020, in the Korean Intellectual Property Office, the disclosures of which are incorporated herein in their entireties by reference.

BACKGROUND

1. Field

The present disclosure relates to semiconductor memory devices including boron nitride layers and apparatuses including the same.

2. Description of Related Art

Due to characteristics such as miniaturization, multi-functionality and/or low manufacturing costs, semiconductor memory devices are in the spotlight as an important factor in the electronics industry. Semiconductor memory devices may be classified into semiconductor memory devices that store logic data, semiconductor logic devices that operate and process the logic data, and hybrid semiconductor memory devices that include memory elements and logic elements.

In general, a semiconductor memory device may include vertically stacked patterns and contact plugs for electrically connecting the vertically stacked patterns. As semiconductor memory devices become more highly integrated, the spacing between patterns and/or the spacing between patterns and contact plugs is gradually decreasing. Because of this, parasitic capacitance between patterns and/or between patterns and contact plugs may increase. The parasitic capacitance may cause a decrease in the performance of a semiconductor memory device, such as a decrease in operating speed.

SUMMARY

Provided are semiconductor memory devices including boron nitride layers having a low dielectric constant and/or apparatuses including the same.

Additional aspects will be set forth in part in the description which follows and, in part, will be apparent from the description, or may be learned by practice of the presented embodiments of the disclosure.

According to example embodiments, a semiconductor memory device includes word lines extending in a first direction on a semiconductor substrate; bit line structures extending across the word lines, the bit line structures extending in a second direction crossing the first direction; contact pad structures between the word lines and between the bit line structures; and spacers between the bit line structures and the contact pad structures. The spacers include a boron nitride layer.

In some embodiments, the spacers may extend in the second direction along one sidewall of the bit line structures.

In some embodiments, the spacers may surround at least a part of the contact pad structures.

In some embodiments, the spacers may be in direct contact with at least a portion of the contact pad structures.

In some embodiments, the bit line structures may include a polysilicon pattern, a barrier/liner pattern, a metal pattern, and a hard mask pattern, which are sequentially stacked on the semiconductor substrate. The spacers may overlap the polysilicon pattern, the barrier/liner pattern, and the metal pattern with respect to the first direction.

In some embodiments, the spacers may be in direct contact with at least one of the polysilicon pattern, the barrier/liner pattern, and the metal pattern.

In some embodiments, the spacers may overlap at least a part of the hard mask pattern with respect to the first direction.

In some embodiments, the boron nitride layer may have a dielectric constant of 2.5 or less at an operating frequency of 100 kHz.

In some embodiments, the boron nitride layer may include at least one of amorphous material and nanocrystalline material.

In some embodiments, the boron nitride layer may be non-porous.

In some embodiments, the bit line structures may include a polysilicon pattern, a barrier/liner pattern, a metal pattern, and a hard mask pattern, which are sequentially stacked on the semiconductor substrate, and the semiconductor memory device may further include capping layers between the metal pattern and the hard mask pattern.

In some embodiments, the capping layers may include a boron nitride layer.

In some embodiments, the boron nitride layer included in the capping layers may have the same physical properties as those of the boron nitride layer included in the spacers.

In some embodiments, end portions of the capping layers may be in contact with the spacers.

In some embodiments, the semiconductor memory device may further include a gate hard mask pattern on the word lines; an interlayer insulating layer on the gate hard mask pattern; and an insulating pattern on the interlayer insulating layer, and at least one of the interlayer insulating layer and the insulating pattern may include a boron nitride layer.

In some embodiments, the boron nitride layer included in at least one of the interlayer insulating layer and the insulating pattern may have the same physical properties as those of the boron nitride layer included in the spacers.

In some embodiments, the insulating pattern may include the boron nitride layer, and the insulating pattern and the spacers may be integrated with each other.

In some embodiments, the interlayer insulating layer may be in contact with the spacers.

According to example embodiments, a semiconductor memory device includes a semiconductor substrate, the semiconductor substrate including active portions spaced apart from each other, the active portions including a plurality of first impurity regions and a plurality of second impurity regions such that each corresponding active portion of the active portions includes a corresponding first impurity region spaced apart from a corresponding second impurity region; word lines extending in a first direction on the semiconductor substrate, the word lines crossing over the active portions between the plurality of first impurity regions and the plurality of second impurity regions; bit line structures extending across the word lines, the bit line structures extending in a second direction crossing the first direction, a lower portion of the bit line structures each including bit line contact patterns contacting the first impurity regions; and spacers extending along at least part of sidewalls of the bit line structures, the spacers including a boron nitride layer.

In some embodiments, the boron nitride layer may include at least one of amorphous material and nanocrystalline material.

In some embodiments, the bit line structures may include a polysilicon pattern, a barrier/liner pattern, a metal pattern, and a hard mask pattern, which may be sequentially stacked on the semiconductor substrate. The spacers may extend along sidewalls of the polysilicon pattern, the barrier/liner pattern, and the metal pattern.

In some embodiments, the semiconductor memory device may further include an interlayer insulating layer on the semiconductor substrate. The bit line contact patterns may extend through the interlayer insulating layer. The interlayer insulating layer may include at least one of amorphous boron nitride or nanocrystalline boron nitride.

According to example embodiments, a device may include a memory and a controller. The memory may include any one of the semiconductor memory devices described above. The controller may be configured to control an operation of the memory. For example, the controller may be configured to at least one of store data or read data in the memory.

In some embodiments, device may be at least one of a computer, a portable electronic device, a display, or a memory system.

BRIEF DESCRIPTION OF THE DRAWINGS

The above and other aspects, features, and effects of certain embodiments of the disclosure will be more apparent from the following description taken in conjunction with the accompanying drawings, in which.

DETAILED DESCRIPTION

Figure 1:
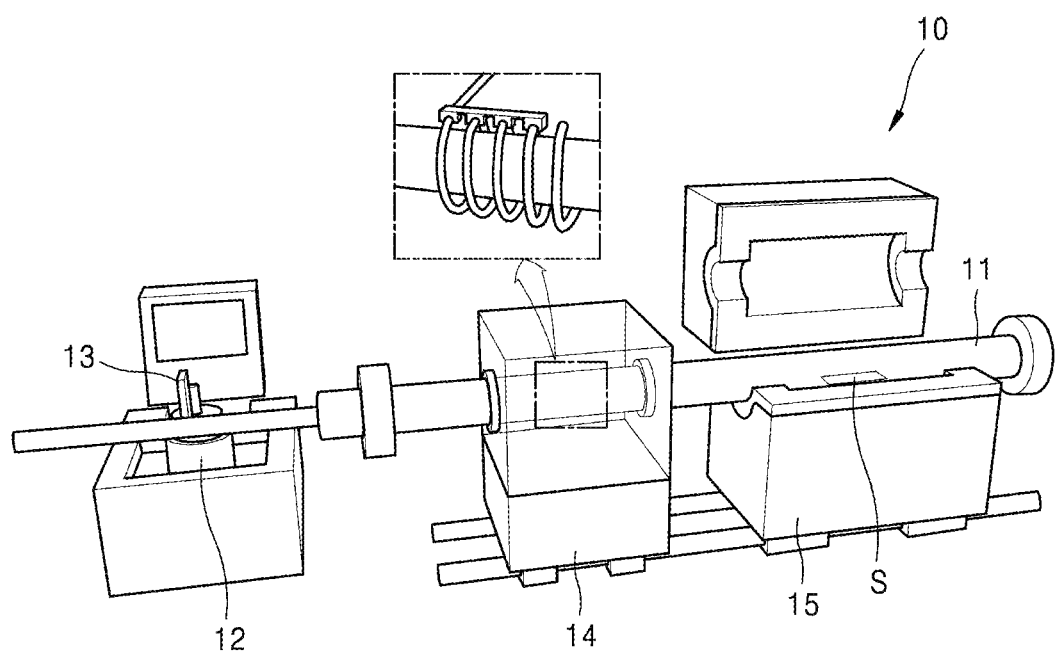
FIG. 1 is a diagram schematically showing a system for fabricating a boron nitride layer, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings. In the accompanying drawings, wherein like reference numerals refer to like elements throughout. Also, the size of each layer illustrated in the drawings may be exaggerated for convenience of explanation and clarity. In this regard, the present embodiments may have different forms and should not be construed as being limited to the descriptions set forth herein.

It will also be understood that when an element is referred to as being "on" or "above" another element, the element may be in direct contact with the other element or other intervening elements may be present. An expression used in the singular encompasses the expression of the plural, unless it has a clearly different meaning in the context. It should be understood that, when a part "comprises" or "includes" an element in the specification, unless otherwise defined, other elements are not excluded from the part and the part may further include other elements. The use of the terms "the" and similar referents in the context are to be construed to cover both the singular and the plural.

In the embodiments below, a boron nitride layer, a method of fabricating the boron nitride layer by using plasma, and an apparatus including the boron nitride layer will be described.

FIG. 1 is a diagram schematically showing a system 10 for fabricating a boron nitride layer, according to an embodiment. Referring to FIG. 1, the system 10 for fabricating the boron nitride layer may include a chamber 11 including a space in which a reaction gas for growth of the boron nitride layer may move, a supply source 12 that supplies the reaction gas to the chamber 11, a flow rate controller 13 that controls the mass flow of the reaction gas moving to the chamber 11, a plasma apparatus 14 that generates plasma in the chamber 11 and a furnace 15 that adjusts the temperature of the chamber 11, and may deposit the boron nitride layer in the chamber 11. In addition, the apparatus for adjusting the temperature may be a hot wall type in which radiant heat is transferred to a substrate, or a cold wall type in which the substrate is directly heated.

Figure 2A:
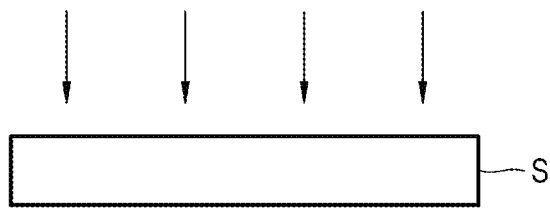
FIGS. 2A to 2C are reference diagrams illustrating a method of fabricating a boron nitride layer, according to an embodiment.
Figure 2B:
Figure 2C:

FIGS. 2A to 2C are reference diagrams illustrating a method of fabricating a boron nitride layer, according to an embodiment.

First, a substrate S may be prepared in the chamber 11 of the system 10. The substrate S may include at least one of a Group IV semiconductor material, a semiconductor compound, an insulating material, and metal. As a specific example, the substrate S may include the Group IV semiconductor material such as Si, Ge, or Sn. Alternatively, the substrate S may include at least one of Si, Ge, C, Zn, Cd, Al, Ga, In, B, C, N, P, S, Se, As, Sb, Te, Ta, Ru, Rh, Ir, Co, Ta, Ti, W, Pt, Au, Ni, and Fe. In addition, the substrate S may further include, for example, N and F as a SiCOH-based composition, and may also include pores to lower the permittivity. In addition, the substrate S may further include a dopant. The materials of the substrate S mentioned above are merely examples.

The substrate S may be pretreated before the substrate S is disposed in the chamber 11. For example, the substrate S may be immersed in an organic solvent such as acetone, sonicated, and then cleaned with iso-propenyl alcohol (IPA) and nitrogen gas. A plasma treatment such as oxygen, hydrogen, $NH_3$, etc. may be performed on the surface of the substrate S, which is cleaned, such that carbon impurities remaining on the surface may be removed. In addition, the substrate S may be immersed in an HF solution to remove natural oxides or remove a residual HF solution using anhydrous ethanol and $N_2$ gas.

The process temperature for growing the boron nitride layer may be about 700° C. or less, which is lower than the temperature used for a chemical vapor deposition process. For example, the process temperature of the inside of the chamber 11 may be about 400° C. Before the process temperature rises, the process pressure for growing the boron nitride layer may be set to about 2 Torr or less. For example, the process pressure may be $10^{-2}$ Torr or less.

Next, a reaction gas for growing the boron nitride layer may be injected into the chamber 11. Here, the reaction gas may be a source for boron nitride for the growth of the boron nitride layer and may be a source including both nitrogen and boron, such as borazine ($B_3N_3H_6$) or ammonia-borane ($NH_3$—$BH_3$). Alternatively, the reaction gas may include a nitrogen source including nitrogen and a boron source including boron. The nitrogen source may include at least one of ammonia ($NH_3$) or nitrogen ($N_2$), and the boron source may include at least one of $BH_3$, $BF_3$, $BCl_3$, $B_2H_6$, $(CH_3)_3B$, and $(CH_3CH_2)_3B$.

The reaction gas may further include an inert gas. The inert gas may include, for example, at least one of argon gas, neon gas, nitrogen gas, helium gas, krypton gas, and xenon gas. The reaction gas may further include a hydrogen gas. In addition, the mixing ratio of the reaction gas injected into the chamber 11 may be variously modified according to the growth conditions of the boron nitride layer.

The flow rate controller 13 may control the flow rate of the reaction gas flowing into the chamber 11. The flow rate of the boron nitride gas may be lower than other reactant gases. When the boron nitride layer is to grown using plasma, the mixing ratio of the reaction gas injected into the chamber 11, that is, the volume ratio of the source of boron nitride and the inert gas, may be, for example, about 1:10 to 5000, and the volume ratio of the source of boron nitride, the inert gas, and the hydrogen gas, may be, for example, about 1:10 to 5000:10 to 500.

Since the source for boron nitride is significantly smaller in proportion to other reaction gases, the crystallinity of boron nitrides may be weak. Thus, the boron nitride layer according to an embodiment may be formed in an amorphous or a nano-sized crystal structure.

When an excess amount of the source for boron nitride is supplied, the boron nitride layer may grow irregularly, and a precursor may be adsorbed, and thus, the flow rate of the source for boron nitride may be low.

For example, while growing the boron nitride layer, the flow rate controller 13 may control the flow rate of the source for boron nitride to 0.05 sccm, the flow rate of the inert gas to 50 sccm, and the flow rate of the hydrogen gas to 20 sccm. The flow rate controller 13 controls the flow rates of the boron nitride source and the inert gas, but is not limited thereto. The flow rate controller 13 may control only the flow rate of the source for boron nitride.

Subsequently, the plasma apparatus 14 may generate plasma inside the chamber 11 while the source for boron nitride is introduced into the chamber 11. Here, the power for plasma generation may be about 10 W to about 4000 W. For example, the power for plasma generation is about 30 W, but is not limited thereto.

The plasma apparatus 14 may be an apparatus that provides plasma including an inductively coupled plasma, a capacitively coupled plasma, a microwave plasma, a plasma enhanced method, an electron cyclotron resonance plasma, arc discharge plasma, a helicon plasma, etc., but is not limited thereto. For example, an inductively coupled plasma apparatus may provide a kind of plasma in which energy is supplied by a current generated by electromagnetic induction, that is, a magnetic field that changes over time. When the power for generating plasma is applied to the inside of the chamber 11 from the plasma apparatus 14, an electric field may be induced inside the chamber 11. As described above, when the electric field is induced in a state where the reaction gas is injected, plasma for the growth of a boron nitride layer BN may be formed.

Referring to FIG. 2B, activated nitrogen N* and activated boron B* may be generated by the plasma of the reaction gas in which the carbon source, the inert gas, and the hydrogen gas are mixed and may be adsorbed onto the surface of the substrate S. In addition, the plasma of the inert gas may continuously induce the activation of the substrate S, and thus, the adsorption of the activated nitrogen N* and the activated boron B* onto the surface of the substrate S may be accelerated. The activated nitrogen N* and the activated boron B* may be adsorbed as amorphous. Even if activated nitrides and boron are combined with each other, since an amount thereof is small, activated nitrides and boron may be adsorbed as the nano-sized crystal.

Referring to FIG. 2C, as the adsorption of the activated nitrogen N* and the activated boron B* onto the surface of the substrate S is accelerated even at a low temperature, the boron nitride layer BN may grow on the surface of the substrate S. According to the present embodiment, since the boron nitride layer BN directly grows on the surface of the substrate S by a low ratio of the activated nitrogen N* and the activated boron B* at a low temperature, for example, at a temperature of 700° C. or less, the boron nitride layer BN, which is grown, may have weak crystalline.

The boron nitride layer BN according to an embodiment may grow as amorphous or may nitride grow as the nano-sized crystal. Although there is a crystal in the boron nitride layer BN formed as amorphous, there may be a crystal of 3 nm or less, and the boron nitride layer BN formed as the nano crystal may include crystals having a size of about 100 nm or less. More specifically, the boron nitride layer BN may include crystals having a size of about 0.5 nm to about 100 nm.

The thickness of the boron nitride layer BN according to an embodiment may be about 100 nm or less. For example, the thickness of the boron nitride layer BN may be 50 nm or less. Further, the boron nitride layer BN may be formed to be thin because the boron nitride layer BN includes amorphous or nano crystals. However, the boron nitride layer BN is not limited thereto. Since the boron nitride layer BN includes amorphous or nano crystals, the boron nitride layer BN may be formed to be thick. The thickness of the boron nitride layer BN may be selected according to the field of application.

After growth, the plasma may be turned off and the furnace 15 may be gradually cooled at the room temperature. For example, the furnace 15 may be cooled at the room temperature by introducing 20 sccm of $H_2$ gas into the chamber 11.

A device may be fabricated by forming another layer on the boron nitride layer BN fabricated by using the above-described method. Alternatively, the fabricated boron nitride layer BN may be transferred to another layer. When transferred, a hydrofluoric acid transfer technique may be applied, but the present disclosure is not limited thereto.

The boron nitride layer BN fabricated as shown in FIGS. 2A to 2C may be amorphous. Although the boron nitride layer BN according to an embodiment includes a crystal, the boron nitride layer BN may include the nano-sized crystal. Because activated nitrogen and boron of a low density directly grow at a low temperature, the crystallinity may be weak. The lower at least one of the growth temperature and the process pressure, the higher the content of amorphous.

In the boron nitride layer BN according to an embodiment, the ratio of nitrogen and boron may be substantially the same. The ratio of boron to nitrogen may be about 0.9 to about 1.1. Further, the boron nitride layer BN may contain hydrogen, but the hydrogen content in the boron nitride layer BN may be small. For example, hydrogen may be about 10% or less and greater than 0%. The boron nitride layer BN may be chemically stable because of its low content of hydrogen.

The boron nitride layer BN according to an embodiment may have a dielectric constant of 3 or less at an operating frequency of about 100 kHz (here, the dielectric constant may mean a relative dielectric constant versus vacuum or air). For example, an amorphous boron nitride layer a-BN may have a dielectric constant of 2.3 or less at the operating frequency of about 100 kHz, and a nanocrystalline boron nitride layer nc-BN may have a dielectric of 2.3 to 2.5 at the operating frequency of about 100 kHz.

In addition, the mass density of the boron nitride layer BN according to an embodiment may vary according to the dielectric constant of the boron nitride layer BN. For example, the boron nitride layer BN according to an embodiment may have a mass density of 1 to 3 $g/cm^3$.

In addition, the breakdown field of the boron nitride layer BN according to an embodiment may be 4 $MVcm^{-1}$ or more. Specifically, the breakdown field of the boron nitride layer BN according to an embodiment may be about 5 to about 10 $MVcm^{-1}$.

The boron nitride layer BN according to an embodiment may have a smooth surface. For example, the surface of the boron nitride layer BN may have a root-mean-square (RMS) roughness value of about 0.3 to about 0.6. The surface roughness of the boron nitride layer BN may be determined by the flow rate of the source for boron nitride.

To obtain the properties of the boron nitride layer BN, the boron nitride layer BN was grown on a Si substrate by an inductively coupled plasma-chemical vapor deposition (ICP-CVD) method at a process pressure of about $10^{-4}$ Torr and a process temperature of about 400° C.

Figure 3A:
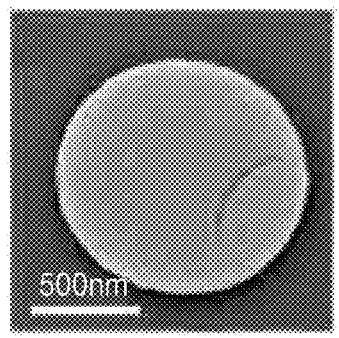
FIGS. 3A to 3D are diagrams showing an atomic structure of a boron nitride layer according to an embodiment.
Figure 3B:
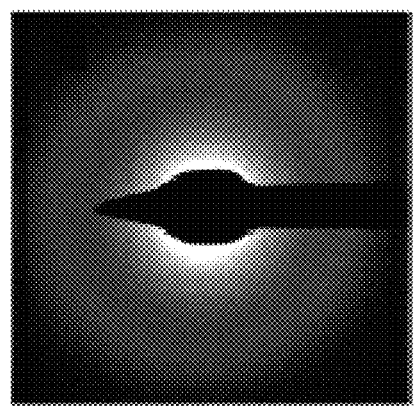
Figure 3C:
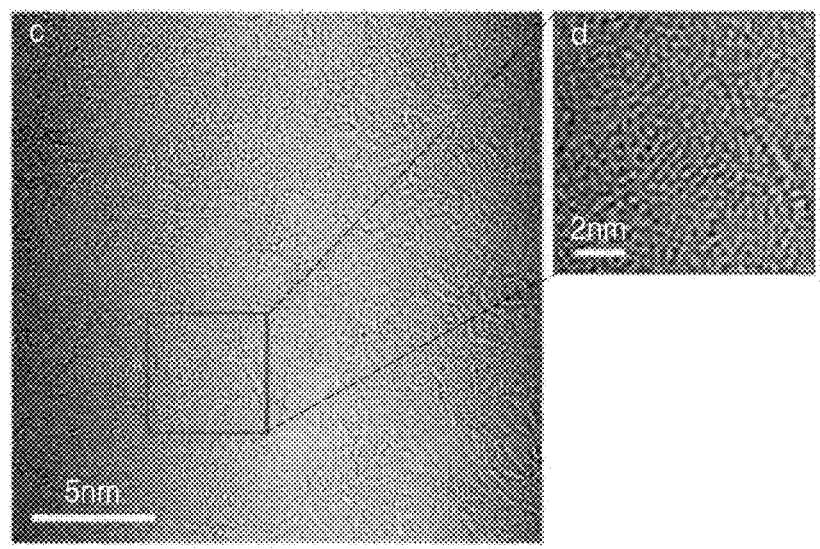
Figure 3D:
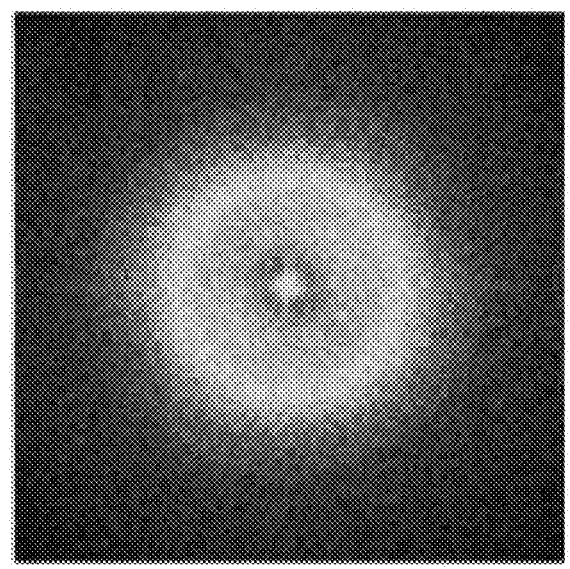

FIGS. 3A to 3D are diagrams showing an atomic structure of a boron nitride layer according to an embodiment. FIG. 3A is a low magnification transmission electron microscopy (TEM) image of the boron nitride layer, and FIG. 3B is an image of selective area electron diffraction of the boron nitride layer. The image of FIG. 3B shows a diffusion pattern with no discernible crystalline rings. FIG. 3C is a high magnification TEM image of the boron nitride layer in which atoms of the boron nitride layer are arranged in disorder. In addition, FIG. 3D is a diagram showing a fast Fourier transform result for the boron nitride layer and shows a typical diffusion diffraction pattern of an amorphous film. Therefore, it may be confirmed that the boron nitride layer fabricated by the fabricating method according to an embodiment is amorphous.

Figure 4A:
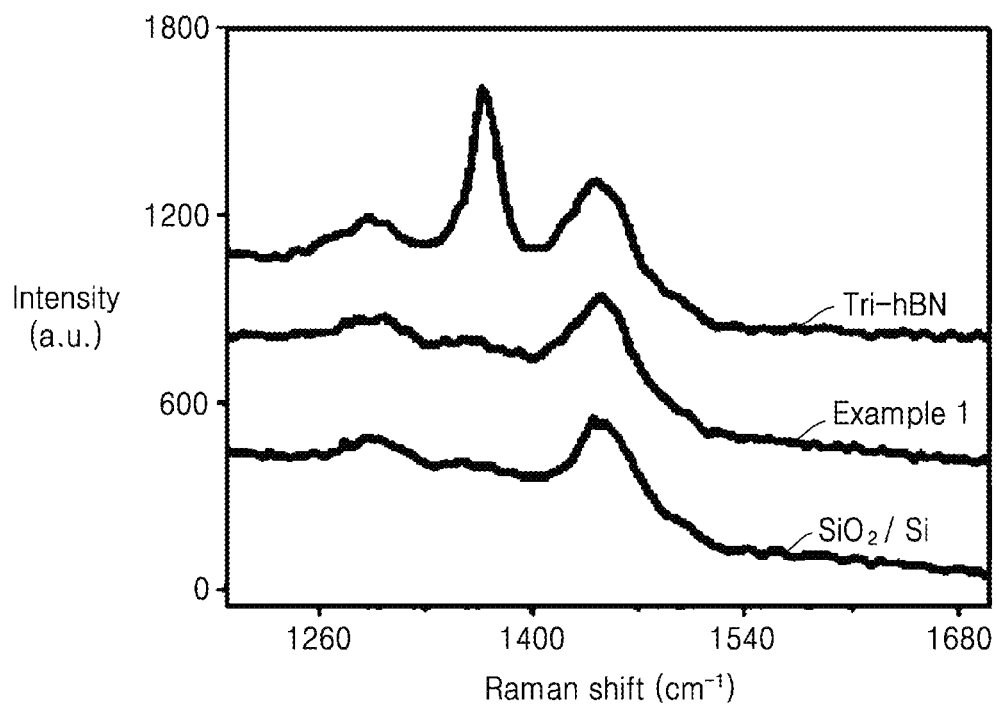
FIG. 4A is a Raman spectrum result with regard to a boron nitride layer according to an embodiment.

FIG. 4A is a Raman spectrum result of a boron nitride layer according to an embodiment. $SiO_2/Si$ is a Raman spectrum result measured with respect to a substrate itself, for example, a substrate including $SiO_2/Si$, and Example 1 is a Raman spectrum result measured after forming the boron nitride layer a-BN according to an embodiment on the substrate including $SiO_2/Si$, and Tri-hBN is a Raman spectrum result measured after epitaxially growing a three-layer hexagonal boron nitride layer on the substrate including $SiO_2/Si$.

As shown in FIG. 4A, the Raman spectrum of the substrate and the Raman spectrum of the boron nitride layer according to an embodiment are similar to each other. When comparing the amorphous boron nitride layer a-BN according to an embodiment and the three-layer hexagonal boron nitride layer Tri-hBN, it may be confirmed that a peak present in the three-layer hexagonal boron nitride layer Tri-hBN at 1373 $cm^{-1}$ is not present in the amorphous boron nitride layer a-BN. This may mean that the boron nitride layer a-BN according to an embodiment does not have crystallinity included in the hexagonal boron nitride layer Tri-hBN.

Figure 4B:
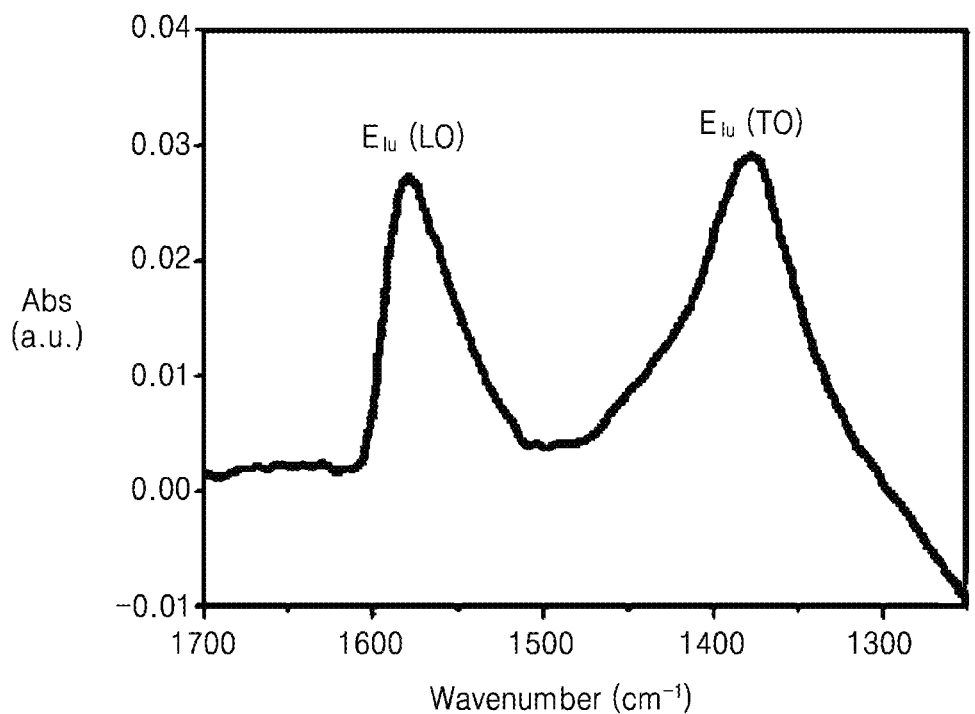
FIG. 4B shows a Fourier transform infrared spectroscopy (FTIR) spectrum result with regard to a boron nitride layer according to an embodiment.

FIG. 4B shows a Fourier transform infrared spectroscopy (FTIR) spectrum result of a boron nitride layer according to an embodiment. FTIR spectrum of the boron nitride layer is measured using s-polarised radiation at an incident angle of 60°. As shown in FIG. 4B, it may be confirmed in the boron nitride layer according to an embodiment that there is an absorption peak near 1370 $cm^{-1}$ that is attributed to a transverse optical mode, whereas there is another absorption peak near 1570 $cm^{-1}$. The absence of a peak near 1570 $cm^{-1}$ means that the boron nitride layer according to an embodiment has amorphous properties.

According to various experimental results, it may be confirmed that the boron nitride layer formed at a process temperature of about 400° C. is amorphous. Hereinafter, the boron nitride layer formed by using the fabricating method according to an embodiment at the process temperature of about 400° C. is referred to as the amorphous boron nitride layer a-BN.

Figure 5:
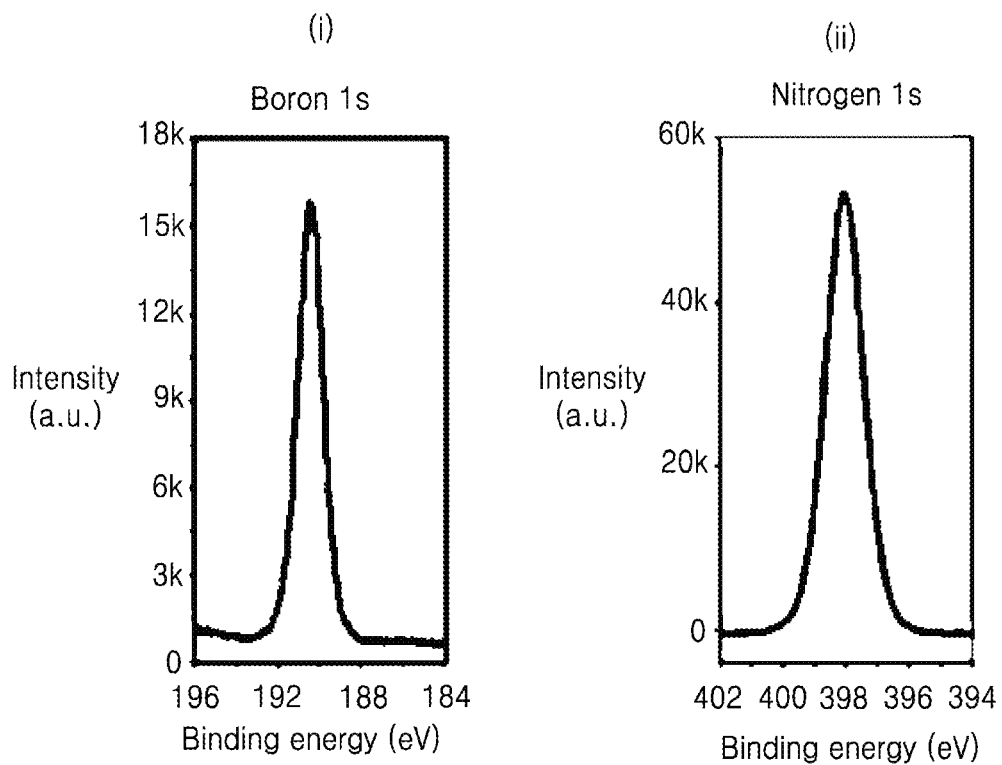
FIG. 5 is a diagram illustrating an X-ray photoelectron spectroscopy (XPS) profile result with regard to an amorphous boron nitride layer according to an embodiment.

FIG. 5 is a diagram illustrating an X-ray photoelectron spectroscopy (XPS) profile result of the amorphous boron nitride layer a-BN according to an embodiment. As shown in FIG. 5, it may be confirmed that peaks of 1 s of boron and 1 s of nitrogen are 190.4 eV and 397.9 eV, respectively. It may be confirmed from the XPS profile of FIG. 5 that the atom ratio of boron and nitrogen is about 1:1.08 based on the size of the peak of each of boron and nitrogen and includes a $sp^2$ combination.

Figure 6:
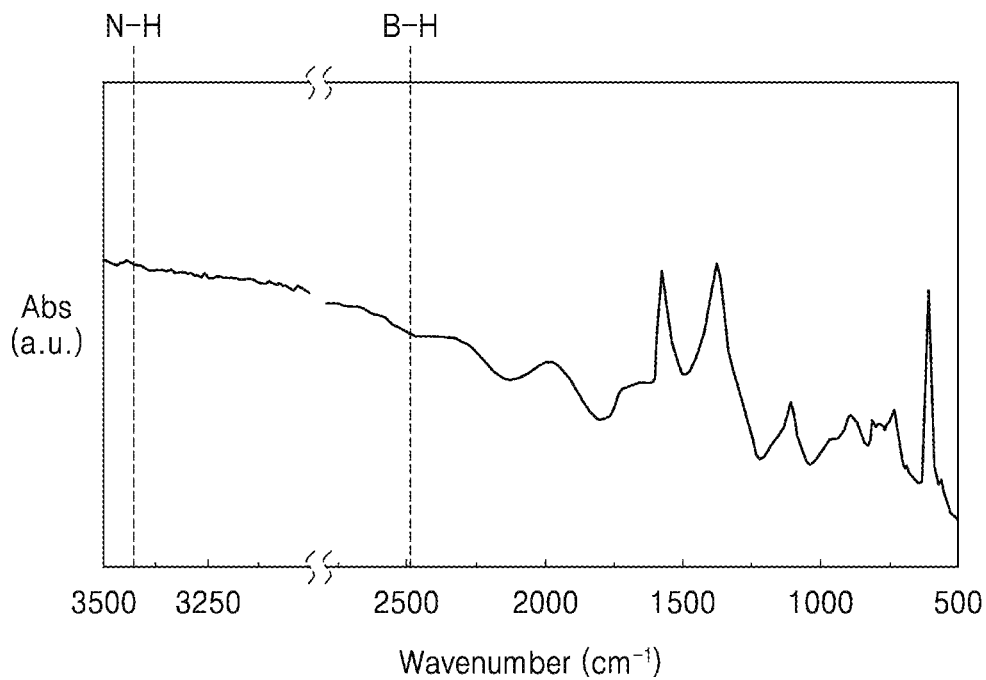
FIG. 6 shows a FTIR spectrum result with regard to an amorphous boron nitride layer according to an embodiment.

FIG. 6 shows a FTIR spectrum result of the amorphous boron nitride layer a-BN according to an embodiment. As shown in FIG. 6, no peak was observed in the FTIR spectrum at frequencies corresponding to B—H and N—H.

Figure 7A:
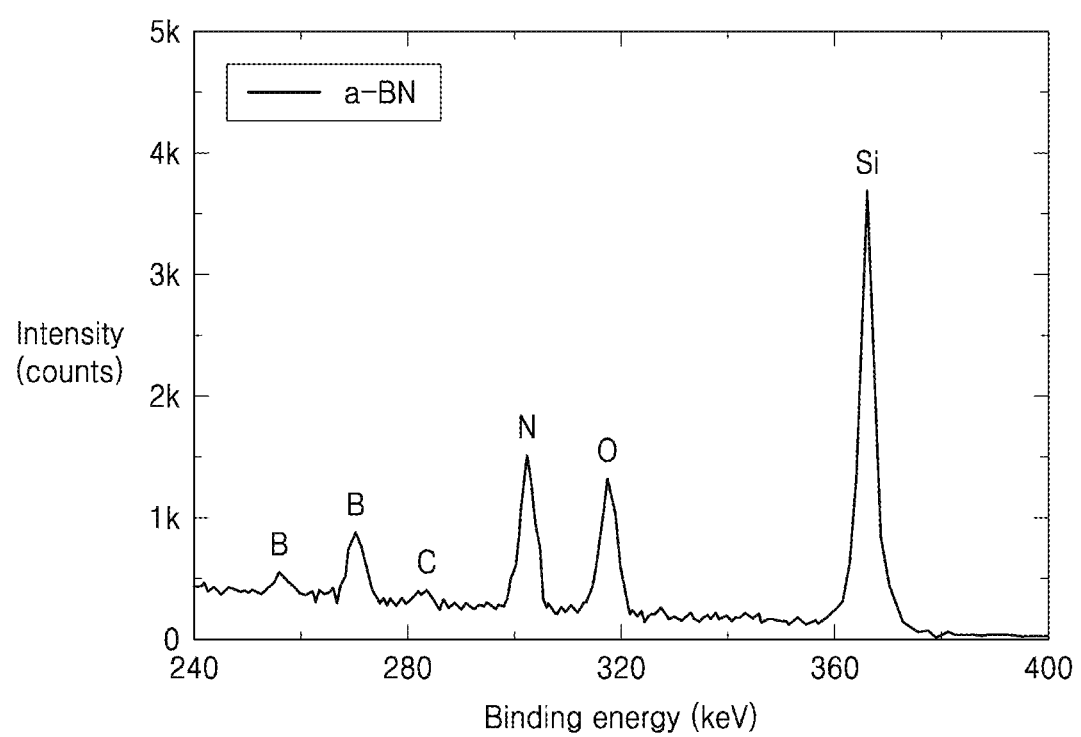
FIG. 7A shows a high-resolution Rutherford backscattering spectrometry (HR-RBS) profile result with regard to an amorphous boron nitride layer according to an embodiment.
Figures 7B, 7C:
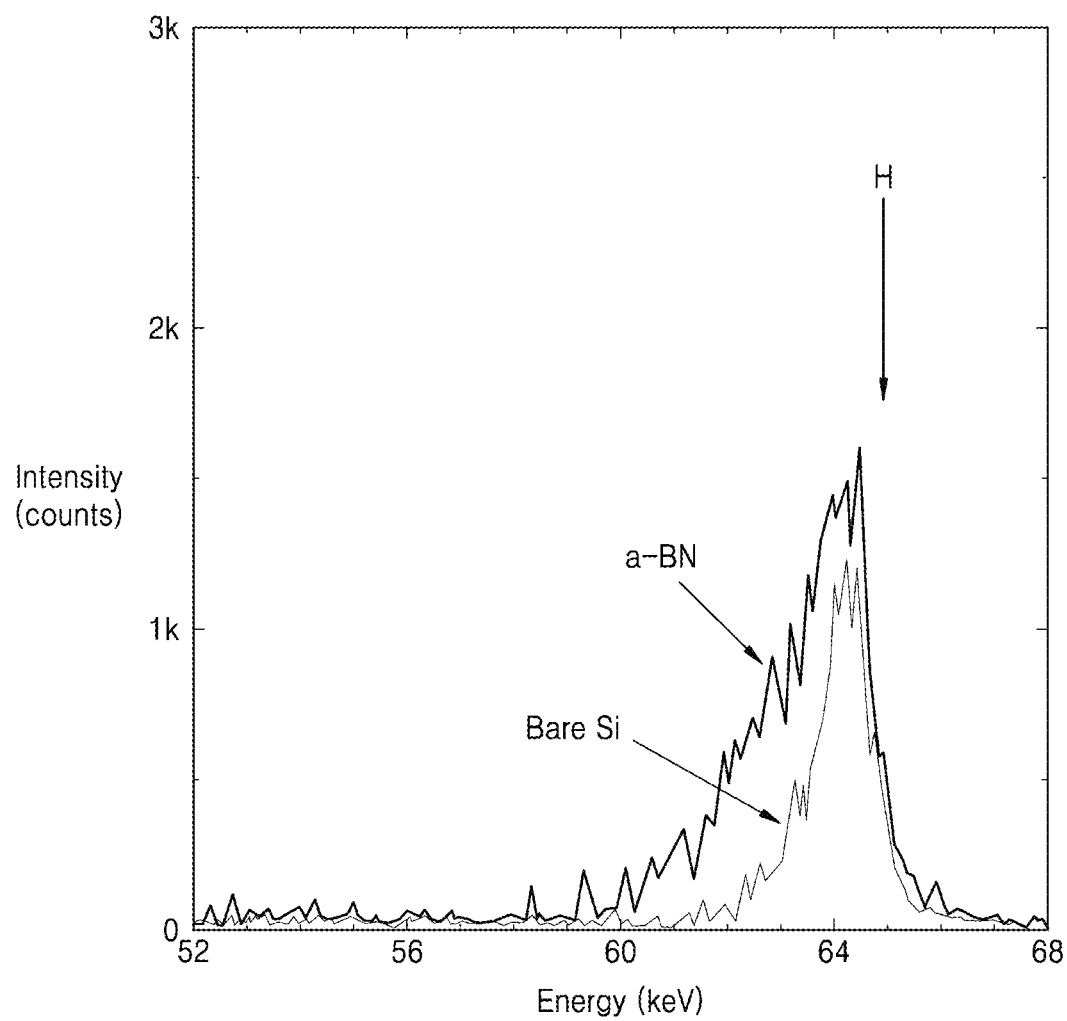
FIG. 7B shows a high-resolution elastic recoil detection analysis (HR-ERDA) profile result with regard to an amorphous boron nitride layer according to an embodiment.
FIG. 7C shows a composition ratio of a boron nitride layer calculated using HR-RBS and HR-ERDA spectra.

FIG. 7A shows a high-resolution Rutherford backscattering spectrometry (HR-RBS) profile result for the amorphous boron nitride layer a-BN according to an embodiment, and FIG. 7B shows a high-resolution elastic recoil detection analysis (HR-ERDA) profile result for the amorphous boron nitride layer a-BN according to an embodiment. FIG. 7A shows the result measured within the energy range of 240-400 keV and FIG. 7B shows the result measured within the energy range of 52-68 keV, wherein it may be seen that Si and O which are atoms of a substrate were measured and B and N which are atoms of a boron nitride layer were measured. In addition, it may be seen that hydrogen was measured.

FIG. 7C shows a composition ratio of a boron nitride layer calculated using HR-RBS and HR-ERDA spectra. As shown in FIG. 7C, it may be confirmed that the ratio of boron and nitrogen is about 1.04:1. In addition, it may be confirmed that hydrogen in the boron nitride layer is about 5.5%.

The properties of the boron nitride layer grown on a substrate are confirmed above. The boron nitride layer according to an embodiment may be grown on a substrate including a catalyst material and then transferred to another substrate.

Figure 8A:
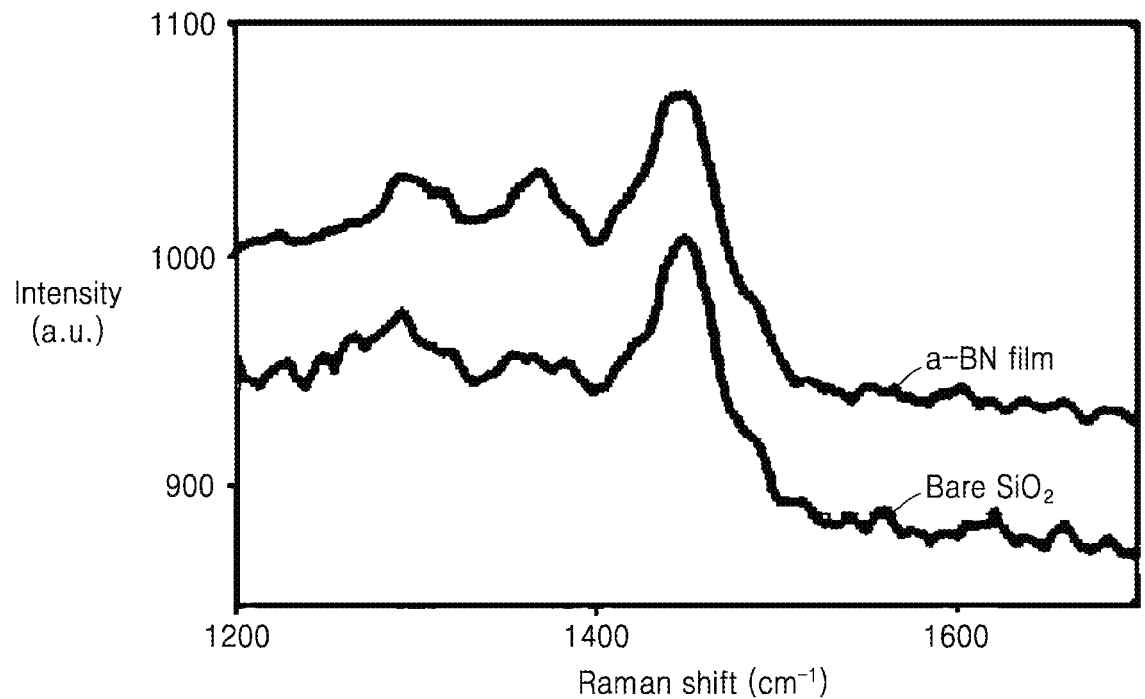
FIG. 8A shows a Raman spectrum result with regard to a boron nitride layer transferred to a substrate according to an embodiment.
Figure 8B:
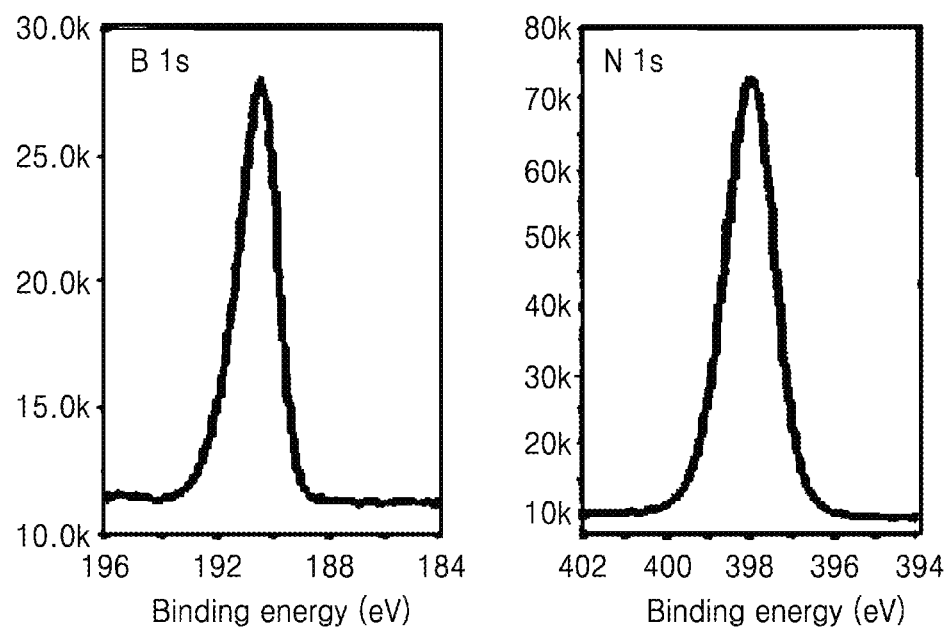
FIG. 8B is an XPS image of a transferred boron nitride layer according to an embodiment.

FIGS. 8A and 8B are diagrams illustrating the properties of a transferred boron nitride layer according to an embodiment. FIG. 8A shows a Raman spectrum result of the boron nitride layer transferred to a $SiO_2$ substrate according to an embodiment. The boron nitride layer is grown on a copper foil at a plasma power of about 30 W and a growth temperature of about 300° C. Then, the grown boron nitride layer was transferred to the $SiO_2$ substrate, and then a Raman spectrum was obtained. It may be confirmed that the Raman spectrum of the $SiO_2$ substrate on which the boron nitride layer is not grown and the Raman spectrum of the transferred boron nitride layer are similar. This may confirm that the transferred boron nitride layer is also amorphous like the $SiO_2$ substrate.

FIG. 8B is an XPS image of a transferred boron nitride layer according to an embodiment. As shown in FIG. 8B, it may be confirmed that peaks of 1 s of boron and 1 s of nitrogen are 190.4 eV and 397.9 eV, respectively, in the same manner as the boron nitride layer grown at the process temperature of about 400° C. It may be confirmed from the XPS profile of FIG. 8B that the atom ratio of boron and nitrogen is about 1:1.08 based on the size of the peak of each of boron and nitrogen and includes a $sp^2$ combination. Therefore, it may be confirmed that even when the growth substrate is a catalyst substrate, the amorphous boron nitride layer a-BN may be obtained by growing the boron nitride layer at a low temperature.

The dielectric properties of the amorphous boron nitride layer a-BN are described below. The dielectric constant is a physical measure of how easily electric dipoles may be induced in materials by application of an electrical field. The dielectric constant of air or vacuum is 1, but electric polarizability in solid state matter arises from dipolar, atomic and electronic components that are most relevant for high performance electronics. The contributions from these may be measured as a function of frequencies ranging from about 10-kHz to about 30-MHz. The dielectric constant may be measured using capacitance-frequency measurements on metal-insulator-metal (MIM) structures. The relative dielectric constants for the amorphous boron nitride layer a-BN and a hexagonal boron nitride layer h-BN were measured, for comparison, at different frequencies.

Figure 9A:
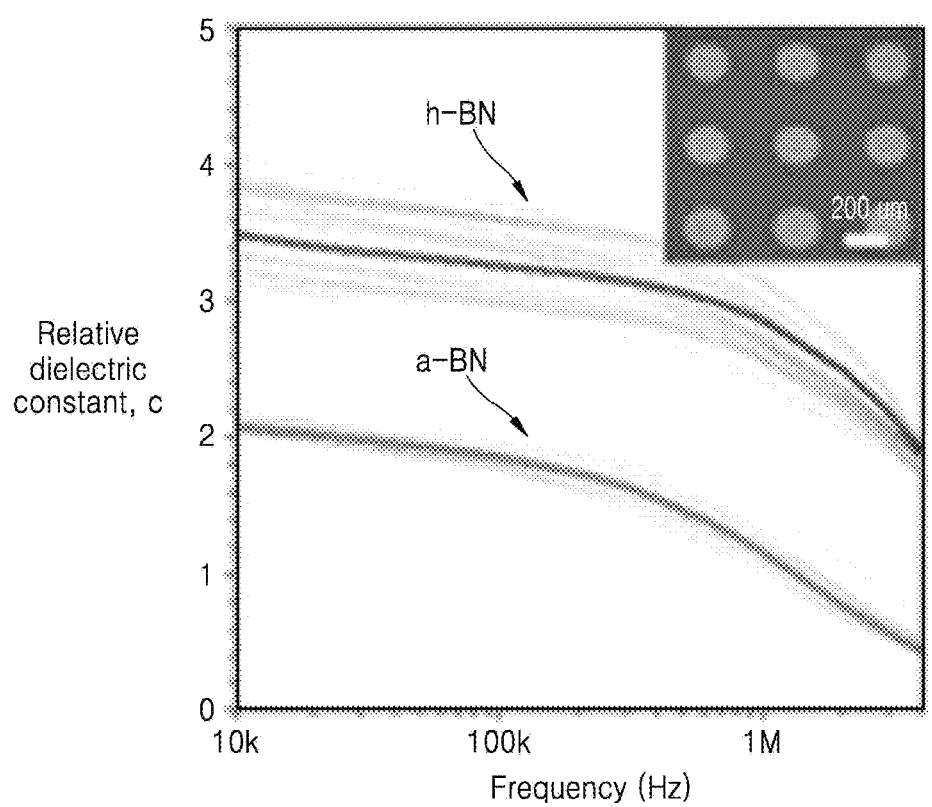
FIG. 9A shows a result of measuring dielectric constant of an amorphous boron nitride layer according to an embodiment.

FIG. 9A shows a result of measuring a dielectric constant of the amorphous boron nitride layer a-BN according to an embodiment. The dielectric constant shown in FIG. 9A is an average value of dielectric constants measured more than 50 times. As shown in FIG. 9A, the dielectric constants of the amorphous boron nitride layer a-BN and the hexagonal boron nitride layer h-BN may be inversely proportional to the operating frequency. It may be confirmed that the dielectric constants of the amorphous boron nitride layer a-BN and the hexagonal boron nitride layer h-BN are about 2 and 3.5, respectively, at an operating frequency of about 10 kHz. It may be confirmed that the dielectric constants of the amorphous boron nitride layer a-BN and the hexagonal boron nitride layer h-BN are about 1.78 and 3.28, respectively, at an operating frequency of about 100 kHz. It may be confirmed that the dielectric constant of the amorphous boron nitride layer a-BN at 1 MHz frequency reduces to about 1.16, which is close to the dielectric constant of air or vacuum. This is because the low dielectric constant of the amorphous boron nitride layer a-BN is attributed to nonpolar bonds between BN and also absence of order that limits and/or prevents dipole alignment even at a high frequency.

A refractive index n of a boron nitride layer may be measured using a spectroscopic ellipsometry (SE) measurement method and a dielectric constant k thereof may be obtained using the relationship of the refractive index n and the dielectric constant k is that $n^2=k$.

Figure 9B:
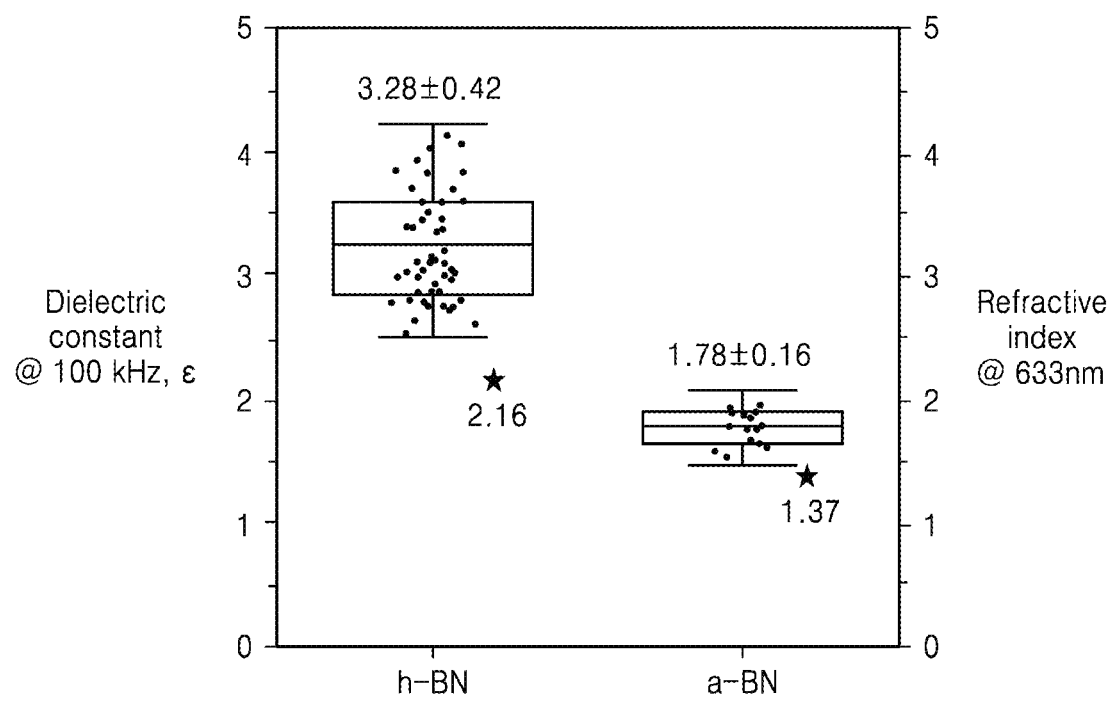
FIG. 9B shows a result with regard to a dielectric constant of a boron nitride layer obtained by using a spectroscopic ellipsometry (SE) measurement method.

FIG. 9B shows a result of a dielectric constant of a boron nitride layer using the SE measurement method. The refractive indices of the hexagonal boron nitride layer h-BN and the amorphous boron nitride layer a-BN at 633 nm wavelength using the SE measurement method were 2.16 and 1.37, respectively. Thus, it may be confirmed that the dielectric constants for the hexagonal boron nitride layer h-BN and the amorphous boron nitride layer a-BN are 4.67 and 1.88, respectively, and are closely identical to values obtained with electrical measurements at 100 kHz.

Figure 10A:
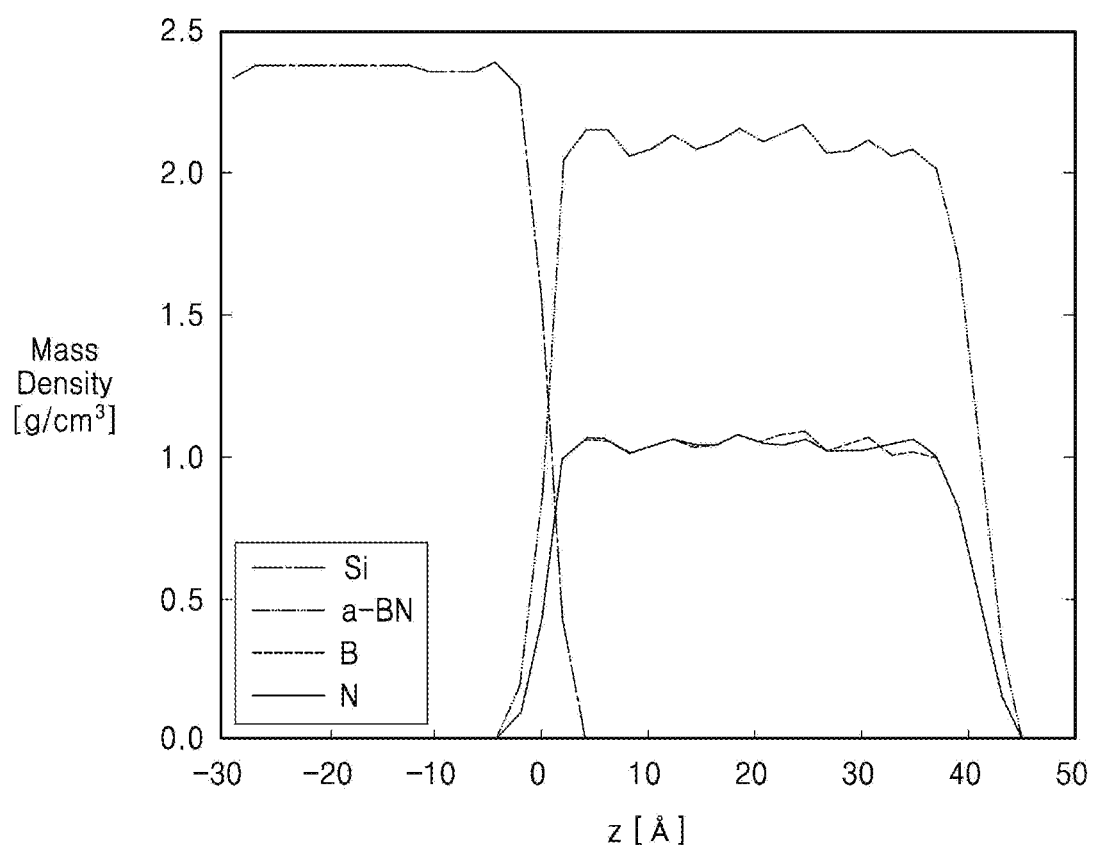
FIG. 10A is a simulation result with regard to a mass density of an amorphous boron nitride layer according to an embodiment.

FIG. 10A is a result of simulating a mass density of the amorphous boron nitride layer a-BN according to an embodiment. The amorphous boron nitride layer a-BN having a thickness of 40 nm was grown on a Si substrate, and then the mass density was simulated along the z direction which is the thickness direction of the amorphous boron nitride layer a-BN on the Si substrate. As shown in FIG. 10A, it may be confirmed that the mass density of the amorphous boron nitride layer a-BN is about 2 g/cm³. It may be seen that the amorphous boron nitride layer a-BN has a low dielectric constant and a high density such that mechanical strength does not deteriorate.

Figure 10B:
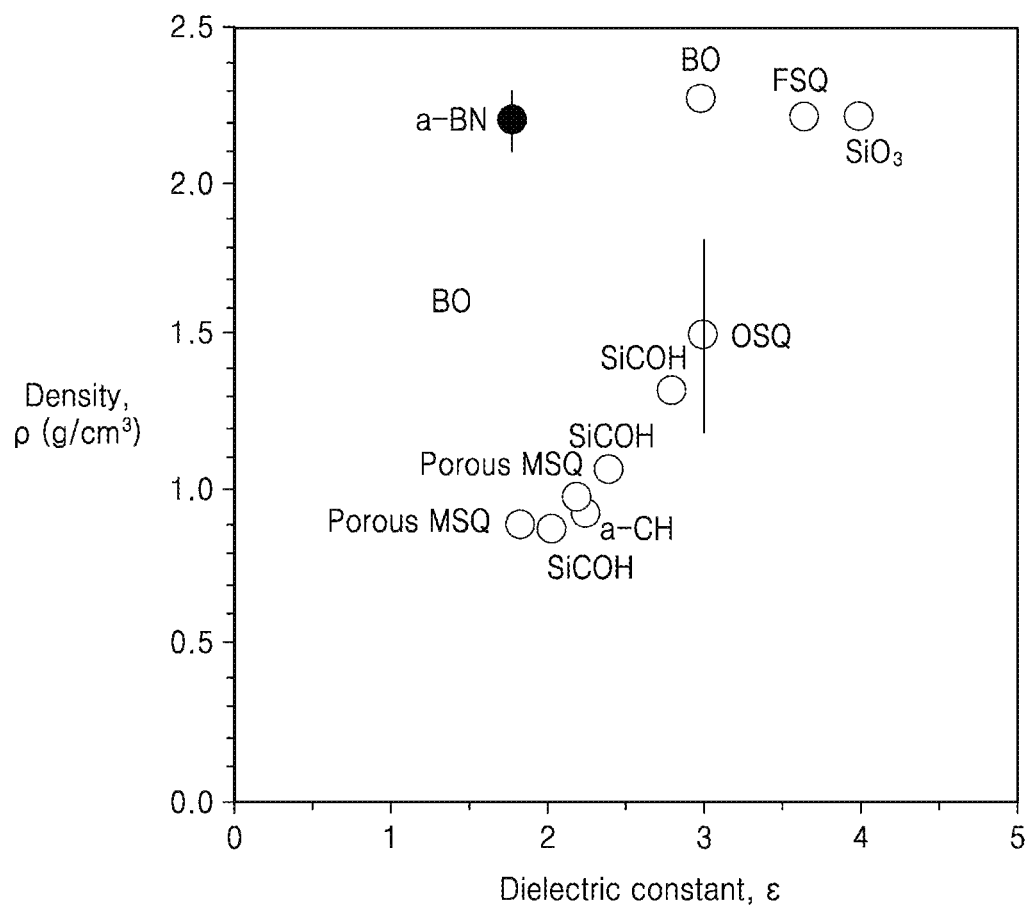
FIG. 10B is a graph showing the relationship between the dielectric constant and mass density of various materials.

FIG. 10B is a graph showing the relationship between the dielectric constant and mass density of various materials. As shown in FIG. 10B, the dielectric constant and the mass density of a material are generally proportional. Thus, a material having a low dielectric constant may have a low mass density and a low mechanical strength. However, the amorphous boron nitride layer a-BN having the dielectric density of about 2 has the mass density of about 2 which is relatively higher than other materials. Thus, the amorphous boron nitride layer a-BN may have a high mechanical strength.

Meanwhile, as another method of implementing low dielectric materials, in order to utilize a low dielectric constant of air, the materials are made porous. However, this may decrease the density of the material, which in turn results in poor mechanical strength. However, the amorphous boron nitride layer a-BN has good mechanical strength because the amorphous boron nitride layer a-BN is not porous as shown in FIGS. 3A to 3D described above. At least one pore may be formed in the amorphous boron nitride layer a-BN. Pores may be formed in the amorphous boron nitride layer a-BN, and thus the dielectric constant may be further lowered. In some cases, other materials may be filled in the pores of the amorphous boron nitride layer a-BN. Even if the pores of the amorphous boron nitride layer a-BN are filled with other materials, the utilization of the amorphous boron nitride layer a-BN may increase without significantly increasing the dielectric constant.

Figure 11:
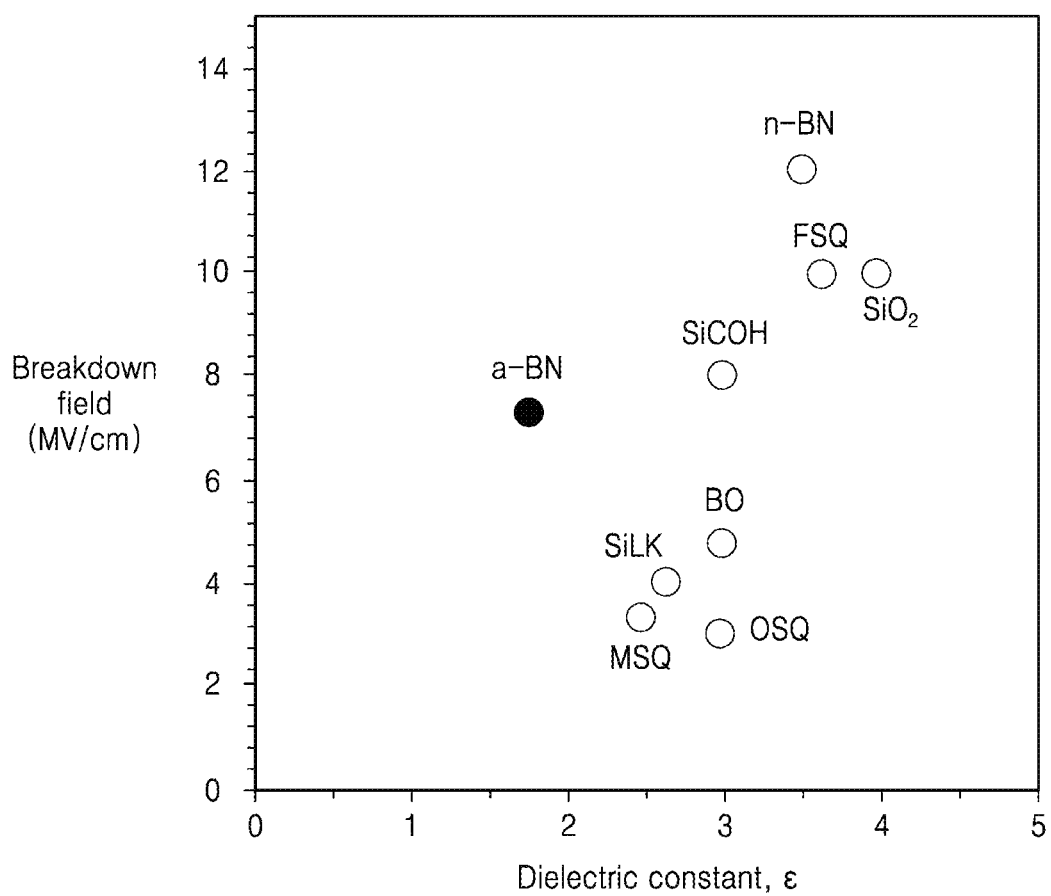
FIG. 11 is a graph showing the relationship between dielectric constants and breakdown fields of various materials.

FIG. 11 is a graph showing the relationship between dielectric constants and breakdown fields of various materials. As shown in FIG. 11, it may be confirmed that the dielectric constants and the breakdown fields are in a proportional relationship. As shown in FIG. 11, it may be confirmed that the breakdown field of the amorphous boron nitride layer a-BN is higher than that of other materials having a dielectric constant close to 2.

Figures 12, 13:
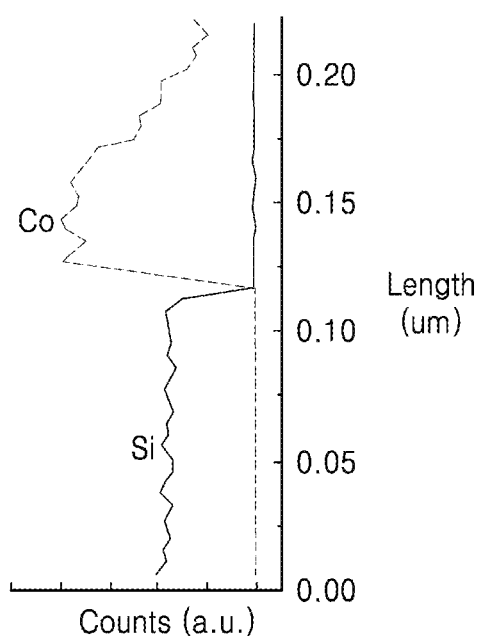
FIG. 12 is a table summarizing the properties of an amorphous boron nitride layer and a hexagonal boron nitride layer according to an embodiment.
FIG. 13 is an energy dispersive spectroscopy (EDS) line profile after a thermal diffusion test for an amorphous boron nitride layer according to an embodiment.

FIG. 12 is a table summarizing the properties of the amorphous boron nitride layer a-BN and a hexagonal boron nitride layer according to an embodiment. As indicated in FIG. 12, it may be confirmed that the amorphous boron nitride layer a-BN has a dielectric constant of 2 or less at an operating frequency of 100 kHz or less. In addition, the breakdown field of the amorphous boron nitride layer a-BN is 7.3 $MV \cdot cm^{-1}$, which is much larger than that of the hexagonal boron nitride layer, and the reflection index for electromagnetic waves of 633 nm is also 2 or less.

The amorphous boron nitride layer a-BN may be used as an interlayer insulating layer because of the electrical and dielectric properties as described above. In particular, when the amorphous boron nitride layer a-BN is used as the interlayer insulating layer between conductive materials, parasitic capacitance may be reduced.

In addition, since the amorphous boron nitride layer a-BN is chemically stable, the amorphous boron nitride layer a-BN may be used as a diffusion barrier.

For example, a key step in back end of line (BEOL) CMOS fabrication of logic and memory devices is the deposition of the diffusion barrier between a low dielectric material and metal wire interconnects to limit and/or prevent metal atom migration into an insulator. Ideally, if the low dielectric material may also serve as the diffusion barrier, it may be unnecessary to deposit a separate diffusion barrier. The amorphous boron nitride layer a-BN according to an embodiment may be used as the diffusion barrier because of its low dielectric constant and large breakdown field.

FIG. 13 is an energy dispersive spectroscopy (EDS) line profile after a thermal diffusion test for the amorphous boron nitride layer a-BN according to an embodiment. The amorphous boron nitride layer a-BN having a thickness of 3 nm was formed on a Si substrate and a cobalt layer of 80 nm was deposited on the amorphous boron nitride layer a-BN according to an embodiment. The diffusion barrier properties of the amorphous boron nitride layer a-BN were tested by annealing Co/a-BN/Si devices in vacuum for 1 hour at 600° C.

As shown in FIG. 13, it may be confirmed that a cobalt component and a silicon component are separated according to the height of the thickness. This means that the cobalt component does not diffuse into a silicon region. It may be seen that the amorphous boron nitride layer a-BN serves as a diffusion barrier.

Figure 14I:
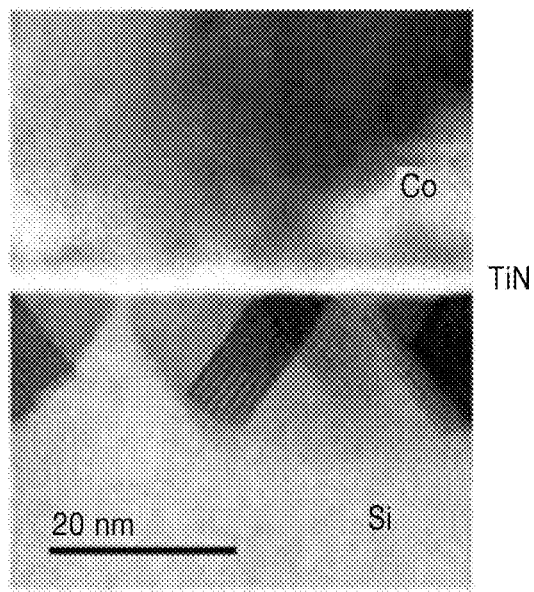
FIG. 14($i$) is a cross-sectional transmission electron microscope (TEM) image and FIG. 14($ii$) an EDS line profile after a heat diffusion test for a TiN layer as a comparative example.
Figure 14:
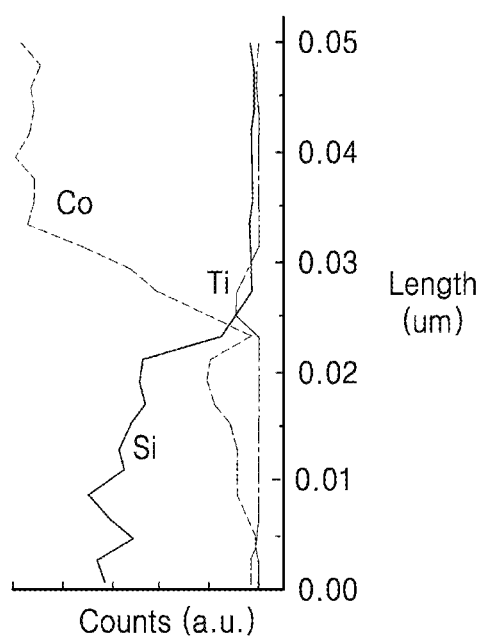

FIG. 14(*i*) is a cross-sectional TEM image and FIG. 14(*ii*) is an EDS line profile after a heat diffusion test for a TiN layer as a comparative example. The TiN layer of a thickness of 3 nm was formed on a silicon substrate, and a cobalt layer of 80 nm was deposited on the TiN layer. Then, Co/TiN/Si devices were annealed at 600° C. in vacuum for about 1 hour. As a result, as shown in FIG. 14(*i*) and FIG. 14(*ii*), it may be confirmed that cobalt was separated from the cobalt layer, and the separated cobalt was diffused to the silicon substrate.

It may be seen from the results of FIGS. 13, 14(*i*), 14(*ii*) that the amorphous boron nitride layer a-BN has a greater effect of limiting and/or preventing the diffusion of metal than the TiN layer which is generally used as a diffusion barrier.

Figure 15:
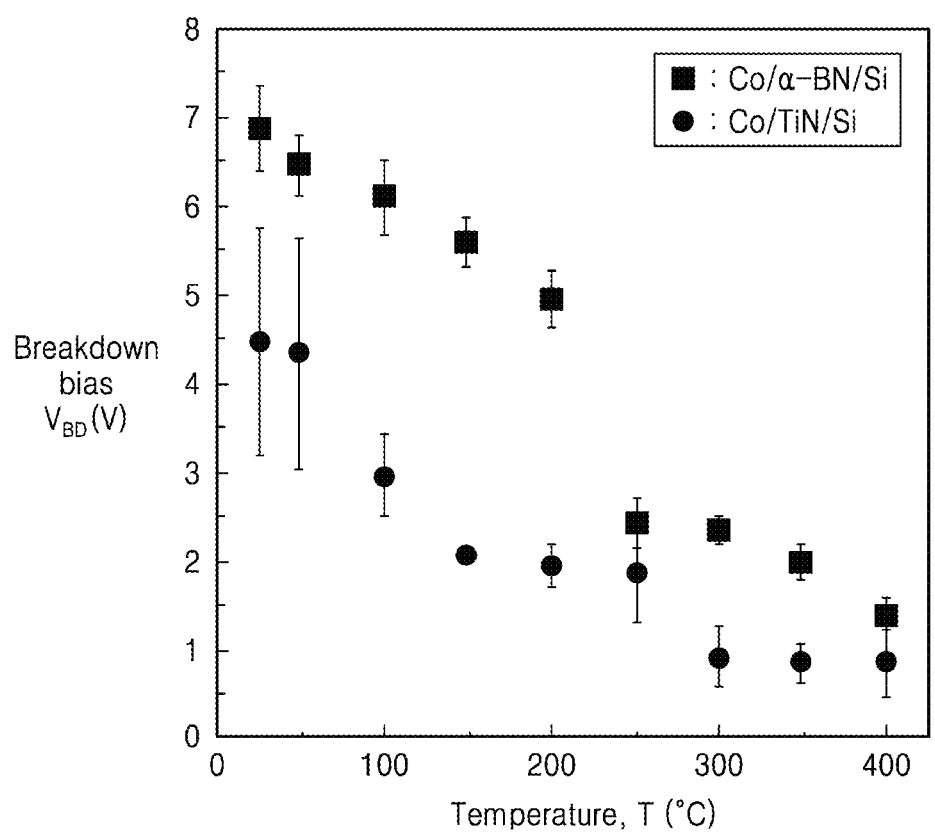
FIG. 15 is a result showing a breakdown bias according to the temperature of an amorphous boron nitride layer according to an embodiment.

FIG. 15 is a result showing a breakdown bias according to the temperature of the amorphous boron nitride layer a-BN according to an embodiment. It may be seen that the breakdown bias of the amorphous boron nitride layer a-BN is inversely proportional to the temperature. Although the breakdown voltage decreases as the temperature increases, it may be seen that the breakdown bias of the amorphous boron nitride layer a-BN is larger than the breakdown bias of a TiN layer. This means that the amorphous boron nitride layer a-BN is stable at various temperatures, and as a result, the amorphous boron nitride layer a-BN may be an excellent low-k material for high-performance CMOS electronic devices.

The boron nitride layer formed by using an inductively coupled plasma-chemical vapor deposition (ICP-CVD) method at a low temperature of 400° C. or less is amorphous and may perform a diffusion barrier function. In addition, the amorphous boron nitride layer a-BN has a low dielectric constant and has a large breakdown field compared to a material having a similar dielectric constant. The amorphous boron nitride layer a-BN is fabricated at a low temperature of 400° C. or less, and a process temperature may be adjusted depending on a substrate, pressure, etc. For example, when the substrate serves as a catalyst for forming the boron nitride layer, boron nitride layer may be formed at a temperature lower than 400° C., for example, 300° C.

A boron nitride layer formed at a temperature higher than 400° C. will be described below. For example, the boron nitride layer was grown on a silicon substrate by using the ICP-CVD method at a process pressure of about $10^{-4}$ Torr and a process temperature of about 700° C.

Figure 16A:
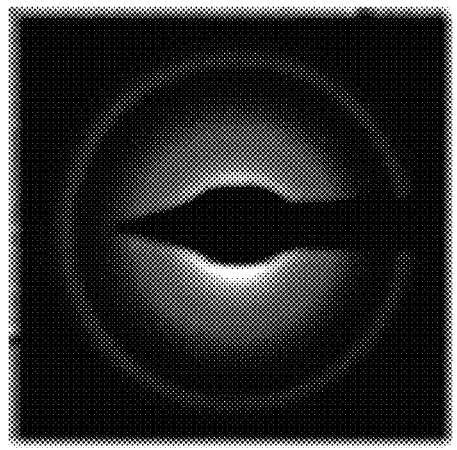
FIG. 16A is an image of selective area electron diffraction of a boron nitride layer grown at about 700° C. according to an embodiment.
Figure 16B:
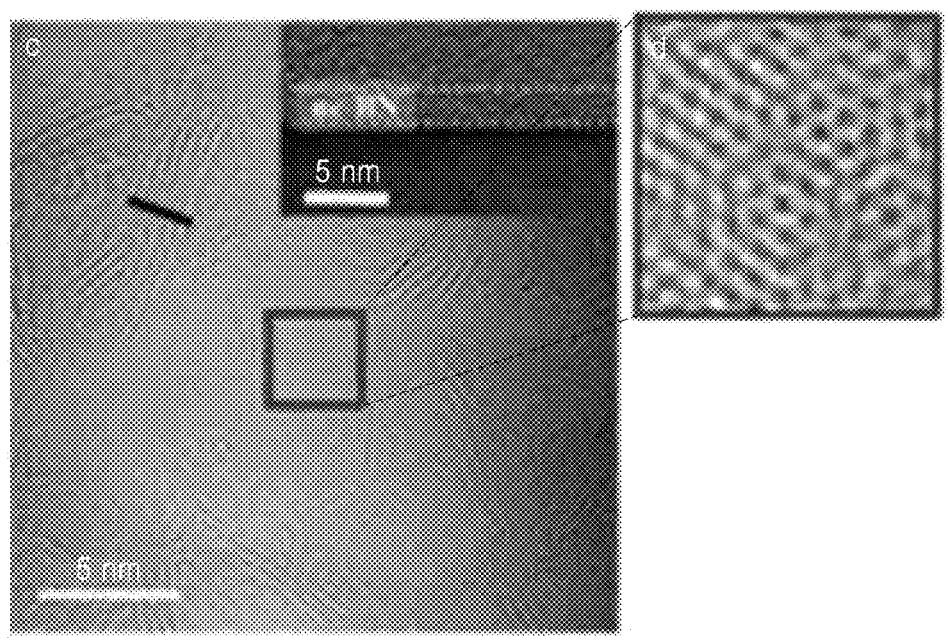
FIG. 16B is a high magnification TEM image of a boron nitride layer grown at about 700° C. according to an embodiment.
Figure 16C:
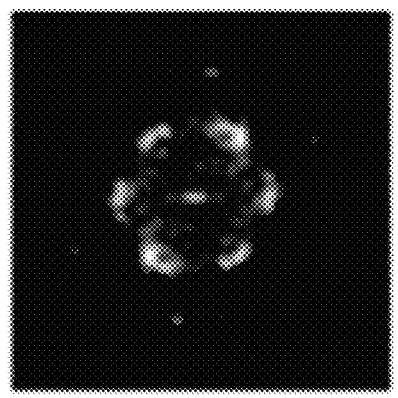
FIG. 16C shows a fast Fourier transform result for a boron nitride layer grown at about 700° C. according to an embodiment.

FIGS. 16A to 16C are diagrams showing an atomic structure of a boron nitride layer grown at about 700° C. according to an embodiment. FIG. 16A is an image of the selective area electron diffraction of the boron nitride layer grown at about 700° C. The image of FIG. 16A shows a polycrystalline ring pattern. FIG. 16B is a high magnification TEM image of the boron nitride layer grown at about 700° C. wherein it may be confirmed that nano-sized small crystallites are arranged. In addition, FIG. 16C is a diagram showing a fast Fourier transform result for the boron nitride layer grown at about 700° C. wherein it may be confirmed that the boron nitride layer has a hexagonal superstructure. Therefore, it may be confirmed that the boron nitride layer grown at a temperature higher than about 400° C., for example, 700° C., includes nano-sized crystallites.

A nanocrystalline boron nitride layer nc-BN has good mechanical strength because the nanocrystalline boron nitride layer nc-BN is not porous, as shown in FIGS. 3A to 3D described above. One or more pore may be formed in the nanocrystalline boron nitride layer nc-BN according to an apparatus to which the nanocrystalline boron nitride layer nc-BN is applied. Pores may be formed in the nanocrystalline boron nitride layer nc-BN, and thus a dielectric constant may be further lowered. According to embodiments, other materials may be filled in the pores of the nanocrystalline boron nitride layer nc-BN. Even if the pores of the nanocrystalline boron nitride layer nc-BN are filled with other materials, the utilization of the nanocrystalline boron nitride layer nc-BN may increase without significantly increasing the dielectric constant.

Figure 17:
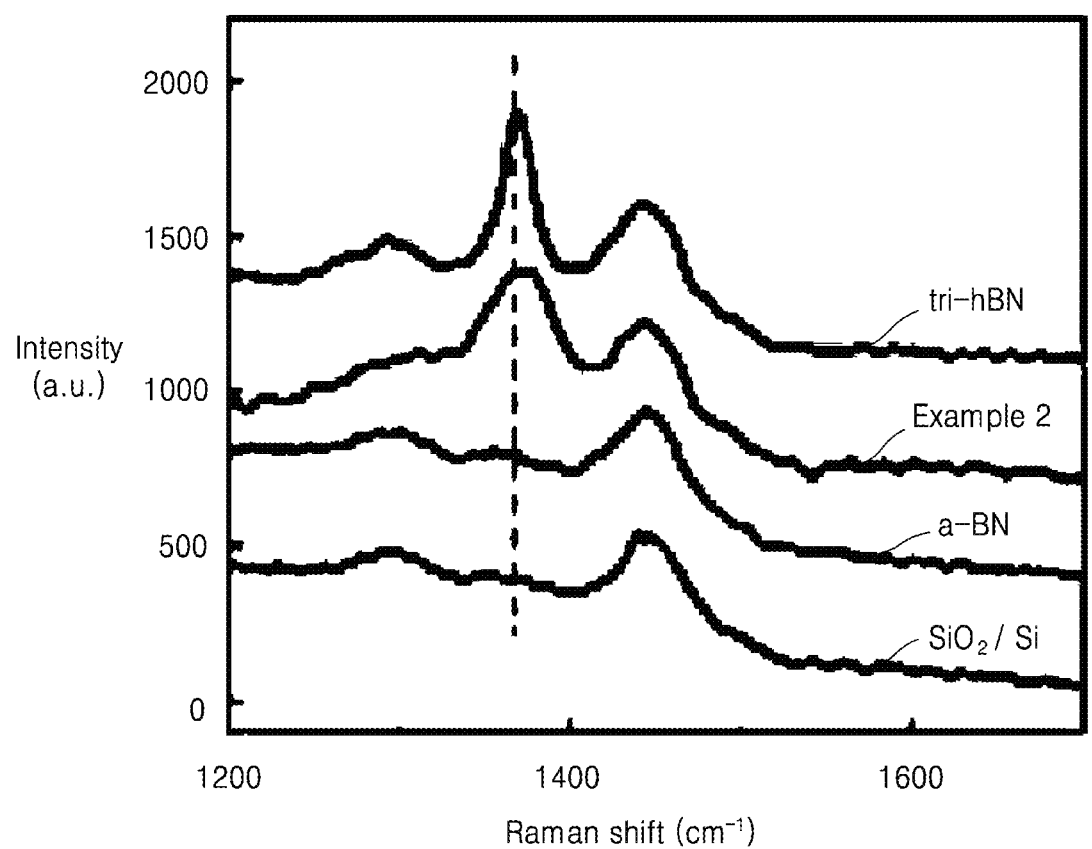
FIG. 17 is a Raman spectrum result with regard to a nanocrystalline boron nitride layer according to an embodiment.

FIG. 17 is a Raman spectrum result of the nanocrystalline boron nitride layer nc-BN according to an embodiment. As shown in FIG. 17, it may be confirmed that a peak is not present at a wavelength of about 1370 $cm^{-1}$ in a substrate including $SiO_2$/Si and the amorphous boron nitride layer a-BN, whereas a peak is present in Example 2 which is a boron nitride layer formed at 700° C. and the hexagonal boron nitride layer Tri-hBN at the wavelength of about 1370 $cm^{-1}$. It may be seen that the boron nitride layer formed at 700° C. has crystallinity. Hereinafter, the boron nitride layer having nano-sized crystallites is referred to as the nanocrystalline boron nitride layer nc-BN.

Figure 18:
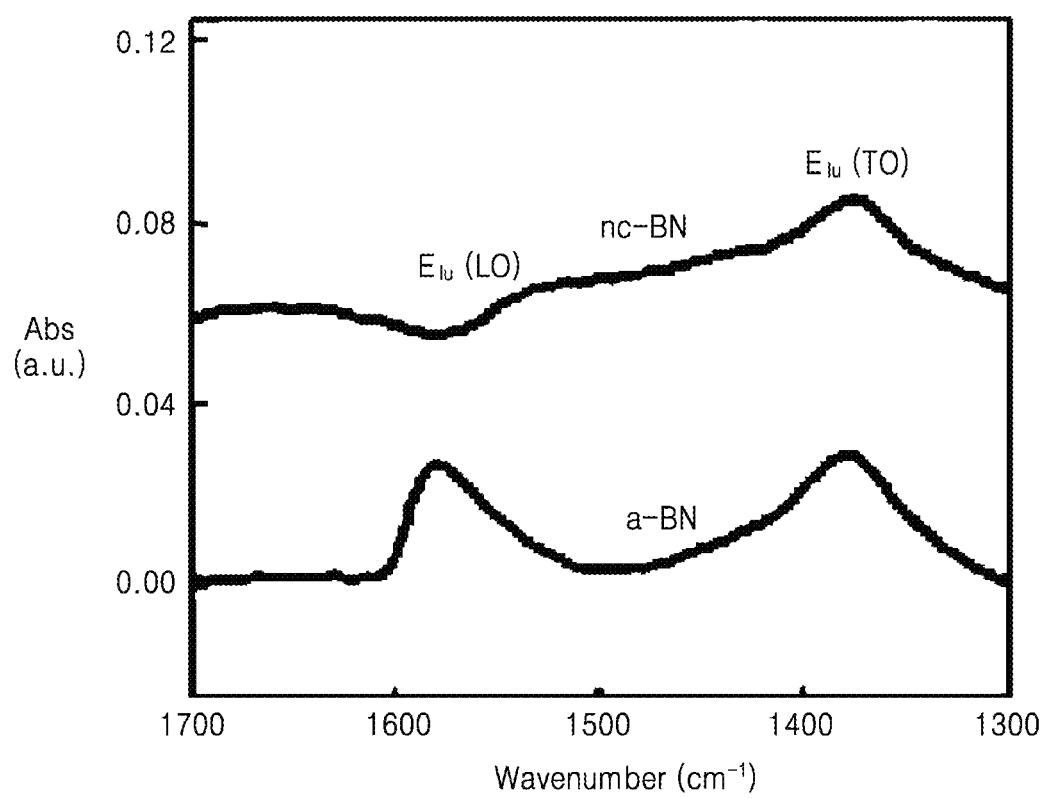
FIG. 18 shows a FTIR spectrum result with regard to a nanocrystalline boron nitride layer according to an embodiment

FIG. 18 shows a FTIR spectrum result of the nanocrystalline boron nitride layer nc-BN according to an embodiment. FTIR spectrum of the boron nitride layer is measured using s-polarised radiation at an incident angle of 60°. As shown in FIG. 18, it may be confirmed in the nanocrystalline boron nitride layer nc-BN that there is an absorption peak near 1370 $cm^{-1}$ that is attributed to a transverse optical mode, whereas there is no absorption peak near 1570 $cm^{-1}$. This means that the nanocrystalline boron nitride layer nc-BN according to an embodiment does not have amorphous properties.

Figure 19:
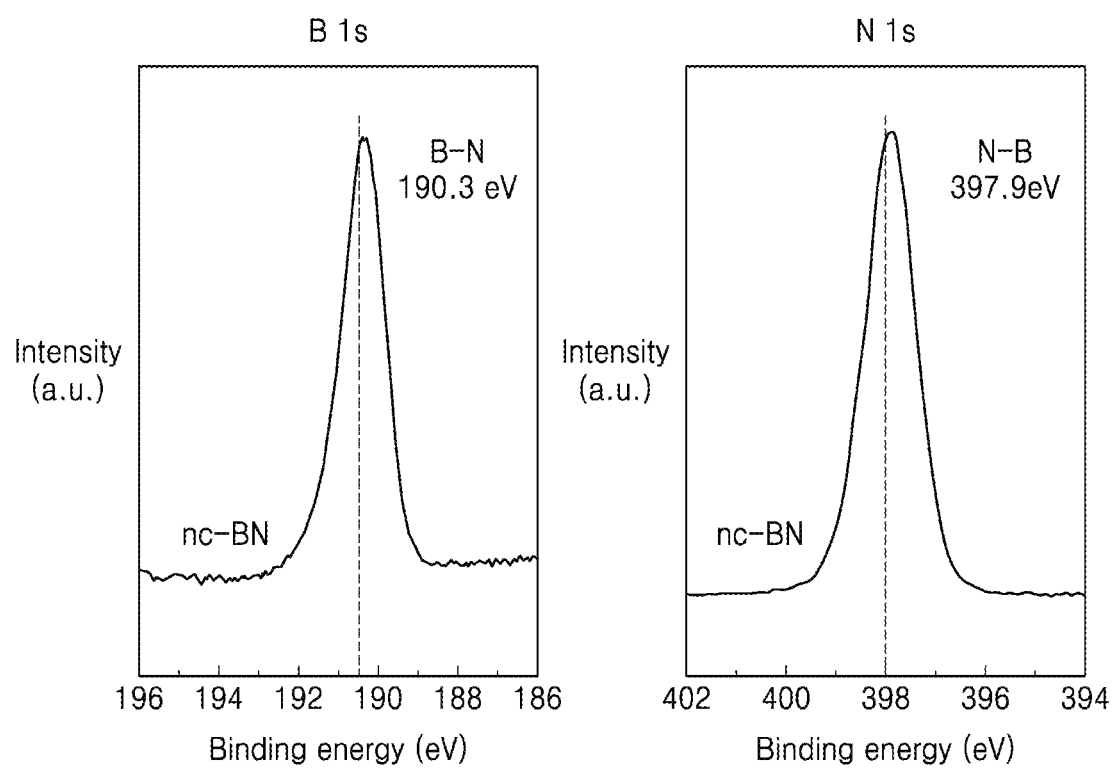
FIG. 19 is a diagram illustrating an XPS profile result with regard to a nanocrystalline boron nitride layer according to an embodiment.

FIG. 19 is a diagram illustrating an XPS profile result of the nanocrystalline boron nitride layer nc-BN according to an embodiment. As shown in FIG. 19, it may be confirmed that peaks of 1 s of boron and 1 s of nitrogen are 190.4 eV and 397.9 eV, respectively. It may be confirmed that the peaks of 1 s of boron and 1 s of nitrogen of the nanocrystalline boron nitride layer nc-BN and the amorphous boron nitride layer a-BN are almost identical. It may be confirmed from the XPS profile of FIG. 19 that the atom ratio of boron and nitrogen is about 1:1.08.

Figure 20:
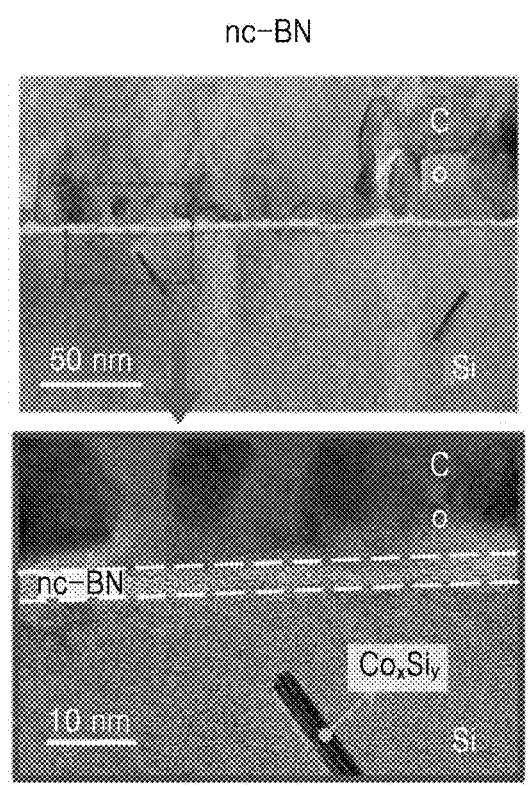
FIG. 20 is a diagram illustrating an example of using a nanocrystalline boron nitride layer as a diffusion barrier layer according to an embodiment.

FIG. 20 is a diagram illustrating an example in which the nanocrystalline boron nitride layer nc-BN is used as a diffusion barrier layer according to an embodiment. A boron nitride layer was grown on a silicon substrate at 700° C., and a cobalt layer of a thickness of 50 nm was deposited on the boron nitride layer. The boron nitride layer grown at 700° C. may be the nanocrystalline boron nitride layer nc-BN. Thereafter, the above-described structure was vacuum annealed at 600° C. for 1 hour. As shown in FIG. 20, a needle-shaped cobalt silicide of a very low density was observed on the silicon substrate. It may be confirmed that the nanocrystalline boron nitride layer nc-BN performed a function of a diffusion barrier even in an annealing condition.

Figure 21:
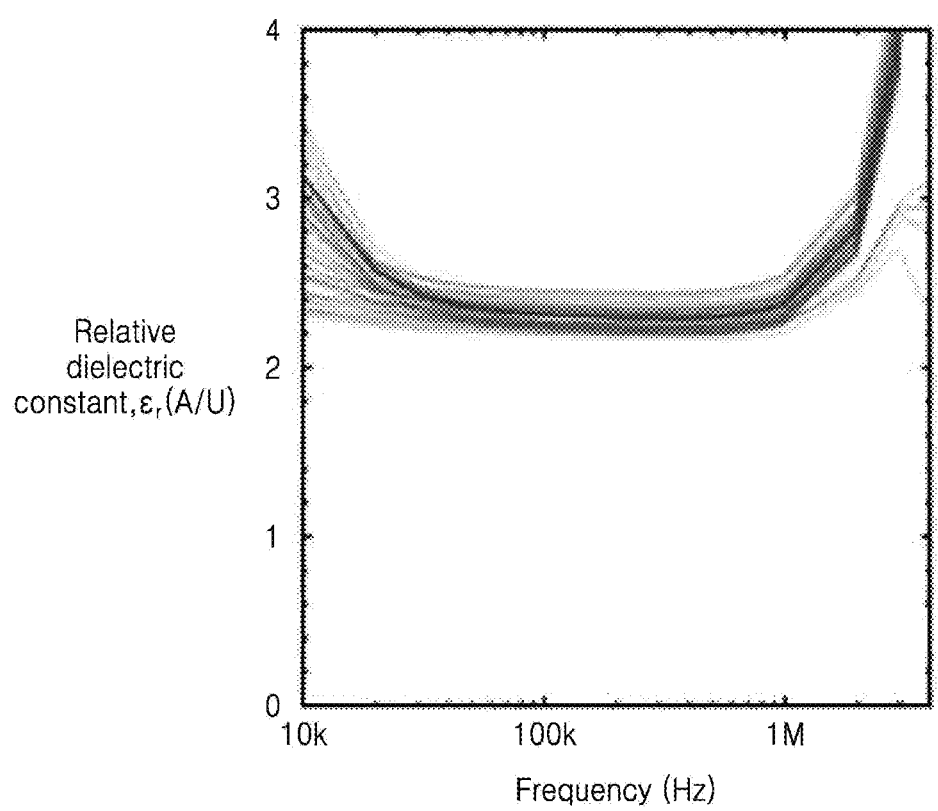
FIG. 21 is a graph showing a dielectric constant of a nanocrystalline boron nitride layer for each frequency according to an embodiment.

FIG. 21 is a graph showing a dielectric constant of the nanocrystalline boron nitride layer nc-BN for each frequency according to an embodiment. As shown in FIG. 21, it may be confirmed that in the operating frequency range of about 50 kHz to about 1 MHz, the nanocrystalline boron nitride layer nc-BN has a dielectric constant of 2.5 or less. For example, it may be confirmed that the nanocrystalline boron nitride layer nc-BN has a dielectric constant of about 2.3 to about 2.5. It may be confirmed that a crystalline hexagonal boron nitride generally has a dielectric constant of about 2.9 to about 3.8 in the operating frequency range of about 50 MHz to about 100 kHz, whereas the nanocrystalline boron nitride layer nc-BN has a low dielectric constant of 2.5 or less. As described above, the nanocrystalline boron nitride layer nc-BN may be used as an interlayer insulating layer because of its low dielectric constant. In particular, when the nanocrystalline boron nitride layer nc-BN is used as the interlayer insulating layer between conductive materials, parasitic capacitance may be reduced.

Even if the amorphous boron nitride layer a-BN itself is not porous, pores may be formed in the amorphous boron nitride layer a-BN depending on an apparatus to which the amorphous boron nitride layer a-BN is applied. Pores may be formed in the amorphous boron nitride layer a-BN, and thus the dielectric constant may be further lowered.

The amorphous boron nitride layer a-BN may have an energy band gap of about 6.00 eV or less. In general, it may be confirmed that a three-layer hexagonal boron nitride layer has an energy band gap of about 6.05 eV, while a boron nitride layer grown at 400° C. has an energy band gap of about 5.96 eV, and a boron nitride layer grown at 700° C. has an energy band gap of about 5.85 eV. That is, the amorphous boron nitride layer a-BN and/or the nanocrystalline boron nitride layer nc-BN has a lower energy band gap than the hexagonal boron nitride layer. Therefore, the amorphous boron nitride layer a-BN and/or the nanocrystalline boron nitride layer nc-BN is chemically stable.

Figure 22A:
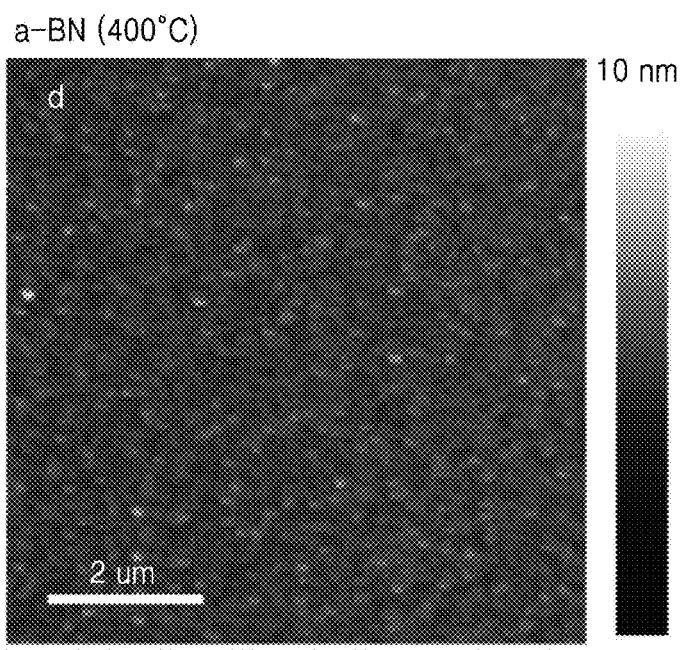
FIG. 22A is an atomic force microscope (AFM) image of a boron nitride layer grown at about 400° C.
Figure 22B:
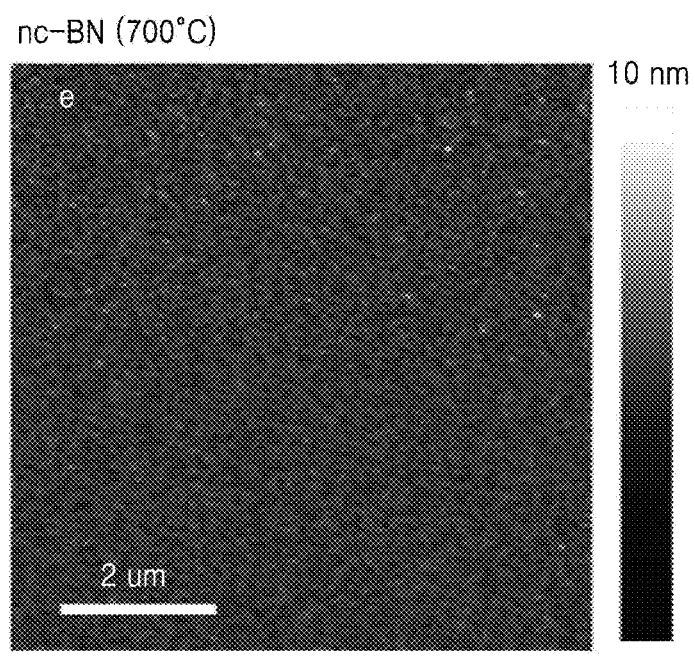
FIG. 22B is an AFM image of a boron nitride layer grown at about 700° C.

FIG. 22A is an atomic force microscope (AFM) image of the boron nitride layer BN grown at about 400° C., and FIG. 22B is an AFM image of a boron nitride layer grown at about 700° C. As shown in FIG. 22A, it was confirmed that the surface roughness of the boron nitride layer BN grown at about 400° C. is about 0.45 nm, and as shown in FIG. 22B, the surface roughness of the boron nitride layer grown at about 700° C. is about 0.39 nm. Because the surface of the amorphous boron nitride layer a-BN is smooth, it is easy to form another layer on the boron nitride layer BN, thereby facilitating manufacturing of an apparatus.

Figure 23:
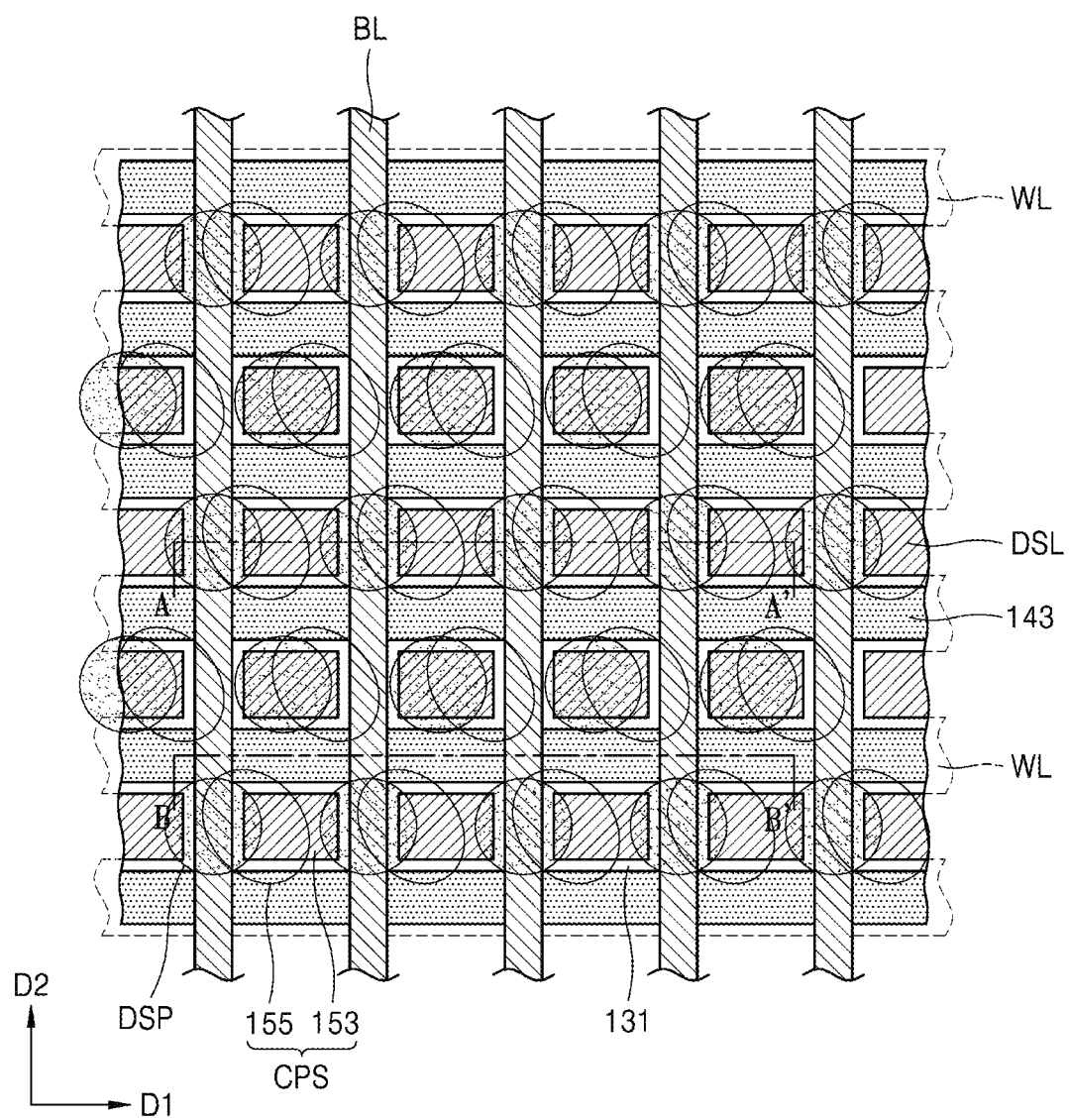
FIG. 23 is a plan view of a semiconductor memory device including a boron nitride layer according to an embodiment.
Figure 24A:
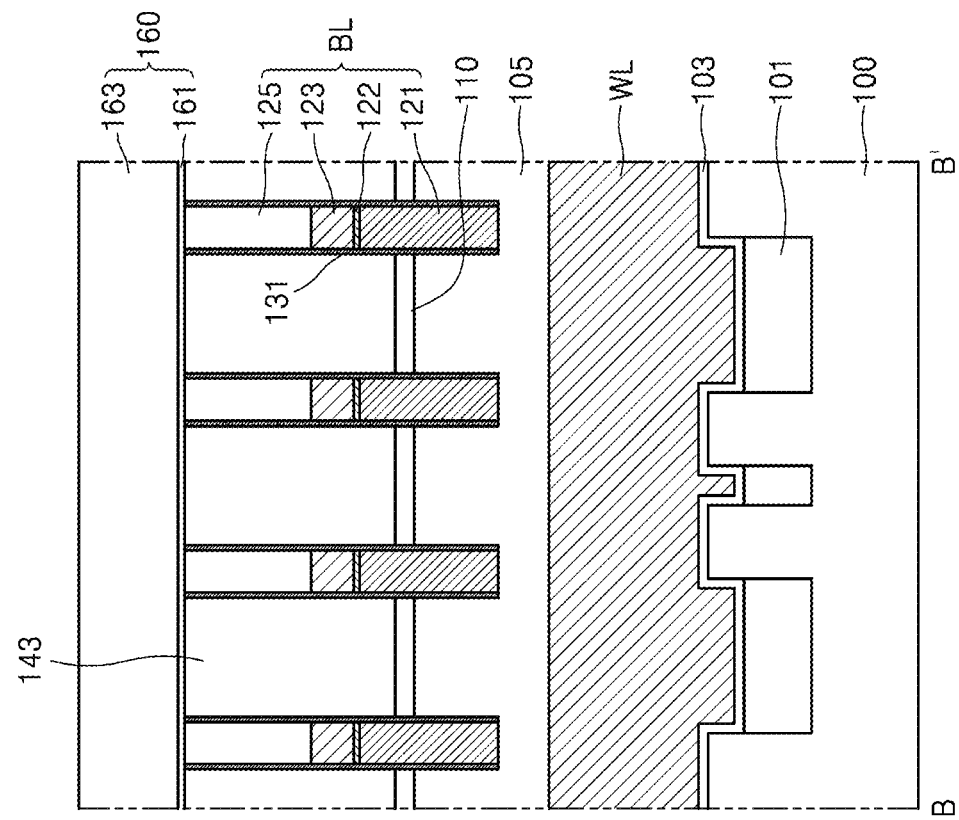
FIG. 24A is a diagram illustrating a cross section taken along lines A-A' and B-B' of FIG. 23.
Figure 24A:
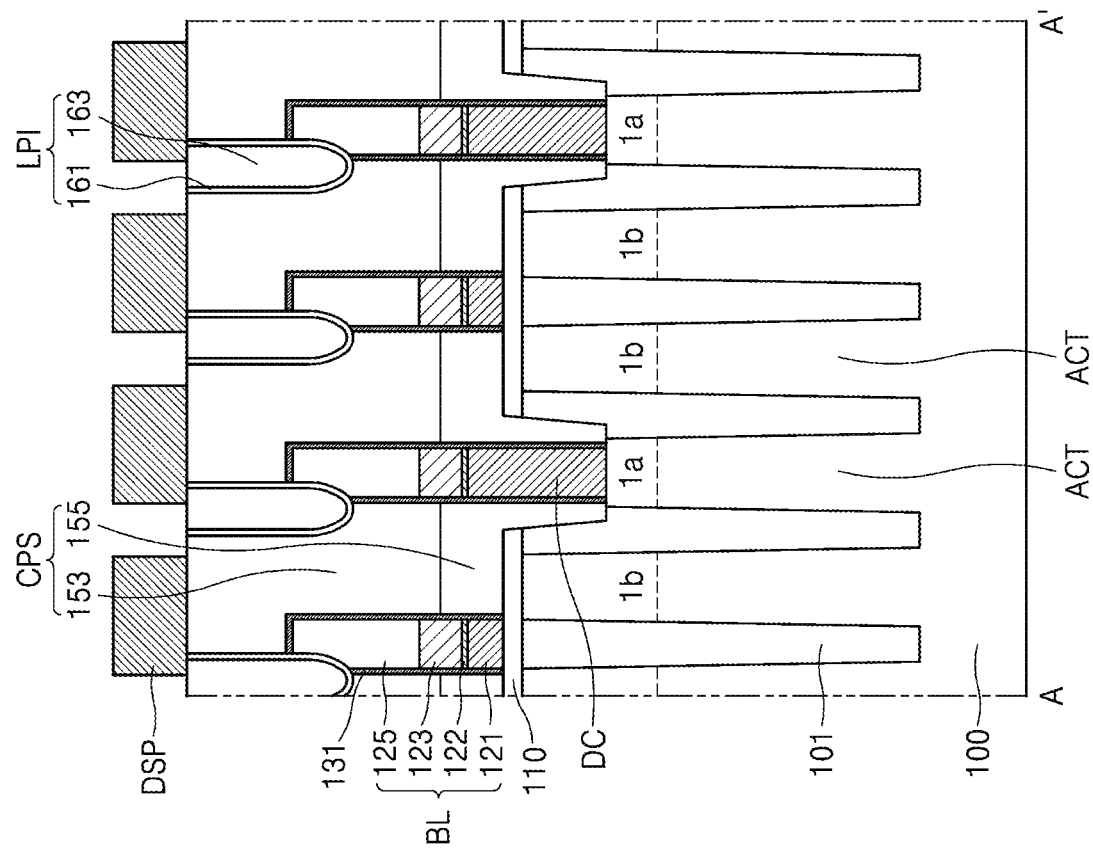
Figure 24B:
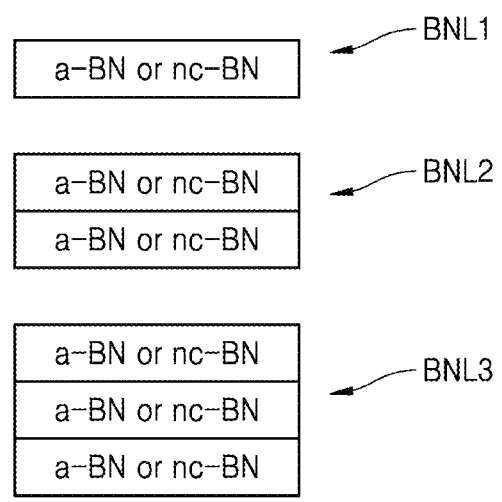
FIG. 24B illustrates boron nitride layers according to some example embodiments.

FIG. 23 is a plan view of a semiconductor memory device including a boron nitride layer according to an embodiment. FIG. 24A is a diagram illustrating a cross section taken along lines A-A' and B-B' of FIG. 23. FIG. 24B illustrates boron nitride layers according to some example embodiments.

A device isolation layer 101 defining active portions ACT may be disposed in a semiconductor substrate 100. The semiconductor substrate 100 may be a silicon substrate, a germanium substrate, and/or a silicon-germanium substrate.

According to an example, the active portions ACT have a rectangular shape (or a bar shape), and may be arranged two-dimensionally along a first direction D1 and a direction D2 across the first direction D1 (e.g., perpendicular to the first direction D1). The active portions ACT may be arranged in a zigzag shape from a plan view, and may have a major axis in a diagonal direction with respect to the first direction D1 and the second direction D2. The active portions ACT may be spaced apart from each other.

Word lines WL may be disposed in the semiconductor substrate 100, and may extend in the first direction D1 from a plan view to cross the active portions ACT and the device isolation layer 101.

A gate insulating layer 103 may be interposed between the word lines WL and the semiconductor substrate 100, and upper surfaces of the word lines WL may be positioned below the upper surface of the semiconductor substrate 100, and a gate hard mask pattern 105 may be disposed on the word lines WL.

First and second impurity regions 1a and 1b may be respectively formed in the active portions ACT on both sides of the word lines WL. The lower surfaces of the first and second impurity regions 1a and 1b may be positioned at a desired and/or alternatively predetermined depth from the upper surfaces of the active portions ACT. The first impurity region 1a may be disposed in each of the active portions ACT between the word lines WL, and the second impurity regions 1b may be spaced apart from the first impurity region 1a and disposed in end portions of each of the active portions ACT. The first and second impurity regions 1a and 1b may be doped with dopants having a conductivity type opposite to that of the semiconductor substrate 100.

According to embodiments, bit line structures BL may extend in the second direction D2 across the word lines WL on the semiconductor substrate 100. The bit line structures BL may be respectively provided on the first impurity regions 1a. According to an example embodiment, the bit line structures BL may include a polysilicon pattern 121, a barrier/liner pattern 122, a metal pattern 123, and a hard mask pattern 125 that are sequentially stacked. An interlayer insulating layer 110 may be disposed between the polysilicon pattern 121 and the semiconductor substrate 100. The interlayer insulating layer 110 may include an insulating material used in a general semiconductor manufacturing process. For example, the interlayer insulating layer 110 may include silicon oxide, nitride, silicon nitride, silicon carbide, silicate, or the like. However, this is merely an example, and various other insulating materials may be used as the interlayer insulating layer 110.

Also, a part of the polysilicon pattern 121 (hereinafter, a bit line contact pattern DC) may contact the first impurity regions 1a. The lower surface of the bit line contact pattern DC may be positioned below the upper surface of the semiconductor substrate 100 and may be positioned above the upper surfaces of the word lines WL. In an example, the bit line contact pattern DC may be locally disposed in a recess region 111 formed in the semiconductor substrate 100 and exposing the first impurity regions 1a.

According to embodiments, the insulating patterns 143 may be spaced apart from each other between the bit line structures BL in the second direction D2 and disposed on the interlayer insulating layer 110. The insulating patterns 143 may overlap with the word lines WL from a plan view, and may have upper surfaces at the same level as the upper surfaces of the bit line structures BL.

According to embodiments, contact pad structures CPS respectively connected to the second impurity regions 1b may be disposed between the bit line structures BL. Each of the contact pad structures CPS may be disposed between the word lines WL and between the bit line structures BL, from a plan view. Each of the contact pad structures CPS may be filled in a space defined by the bit line structures BL adjacent in the first direction D1 and the insulating patterns 143 adjacent in the second direction D2.

Upper surfaces of the contact pad structures CPS may be positioned on the upper surfaces of the bit line structures BL, and parts of the contact pad structures CPS may overlap with parts of the bit line structures BL from a plan view. In embodiments, the upper width of the contact pad structures CPS may be greater than the distance between the bit line structures BL or the width of the bit line structures BL.

In embodiments, each of the contact pad structures CPS may include a contact conductive pattern 153 and a landing pad 155 in contact with the second impurity region 1b.

The contact conductive pattern 153 may include, for example, a polysilicon layer doped with impurities, and may directly contact the second impurity regions 1b through the interlayer insulating layer 110. In an example, the contact conductive pattern 153 may be positioned below the upper surface of the semiconductor substrate 100, and may be positioned above the lower surface of the bit line contact pattern DC. Further, the contact conductive pattern 153 may be insulated from the bit line contact pattern DC by a bit line contact spacer DCP. The upper surface of the contact conductive pattern 153 may be positioned below the upper surface of the metal pattern 123 of the bit line structures BL.

Although not shown in the drawing, a contact silicide pattern (not shown) may be covered on the upper surface of the contact conductive pattern 153. The contact silicide pattern may include, for example, titanium silicide, cobalt silicide, nickel silicide, tungsten silicide, platinum silicide, or molybdenum silicide. In another example, the contact silicide pattern may be omitted.

The upper surface of the landing pad 155 may be positioned above the upper surfaces of the bit line structures BL and the lower surface of the landing pad 155 may be positioned below the bit line structures BL. For example, the lower surface of the landing pad 155 may be positioned below the upper surface of the metal pattern 123 of the bit line structures BL.

The landing pad 155 may be electrically connected to each of the second impurity regions 1b through the contact conductive pattern 153. The landing pad 155 may include a metal barrier layer pattern and a pad metal pattern sequentially stacked.

According to embodiments, the landing pad 155 may include a lower portion filled between the bit line structures BL and the insulating patterns 143 and an upper portion extending from the lower portion on parts of the bit line structures BL. That is, the upper portion of the landing pad 155 may overlap parts of the bit line structures BL from a plan view. In other words, the upper width of the landing pad 155 may be greater than the distance between the bit line structures BL or the width of the bit line structures BL. As described above, because the upper portion of the landing pad 155 extends onto the bit line structures BL, the area of the upper surface of the landing pad 155 may increase.

According to embodiments, the upper portion of the landing pad 155 may have an elliptical shape having a major axis and a minor axis from a plan view, and may have the long axis in the oblique direction with respect to the first direction D1 and the second direction D2. According to embodiments, the upper portion of the landing pad 155 may have a round rhombus, a round trapezoid, or a round square.

According to embodiments, a spacer 131 may be interposed between the bit line structures BL and the contact pad structures CPS. The spacer 131 may extend in the second direction D2 along one sidewalls of the bit line structures BL. In addition, from a plan view, the spacer 131 may surround parts of each of the contact pad structures CPS between the bit line structures BL. The spacer 131 may have a ring shape. The spacer 131 may extend on the interlayer insulating layer 110 in the second direction D2 along both sidewalls of the bit line structures BL, and may extend between the bit line structures BL and the insulating patterns 143 in the second direction D2 between the bit line structures BL and the contact pad structures CPS.

The spacer 131 may include a boron nitride layer according to an embodiment. For example, the spacer 131 may include at least one of an amorphous boron nitride layer and a nanocrystalline boron nitride layer. When the boron nitride layer according to an embodiment has a dielectric constant of about 2.5 or less, the boron nitride layer as the spacer 131 may not only support the bit line structures BL but also reduce parasitic capacitance that affects the bit line structures BL. The spacer 131 may further include a dielectric material of a low dielectric constant in addition to the boron nitride layer according to an embodiment.

In some embodiments, the spacer 131 may include a boron nitride later that, as depicted in FIG. 24B, may be a single layer BNL1 of amorphous boron nitride (a-BN) or nanocrystalline boron nitride (nc-BN), or a double layer BNL2 or plurality of layers (e.g., triple layer BNL3) of amorphous boron nitride (a-BN) or nanocrystalline boron nitride (nc-BN), but example embodiments are not limited thereto. In the multi-layer boron nitride layers, such as the double layer BNL2 and the triple layer BNL3, the layers may be the same material or some layers may be different materials than other layers. For example, the double layer BNL2 and triple layer BNL3 may be all amorphous boron nitride (a-BN) layers, all nanocrystalline boron nitride (nc-BN) layers, or any combination amorphous boron nitride (a-BN) layer(s) and nanocrystalline boron nitride (nc-BN) layer(s).

In the related art, silicon nitride is formed on the spacer 131 in order to reduce parasitic capacitance affecting the bit line structures BL. Silicon nitride may form a depletion region on a junction interface with the polysilicon pattern 121 to increase the resistance of the bit line structures BL. Because the boron nitride layer according to an embodiment has the low dielectric constant, when used as a material of the spacer 131, physical rigidity may increase and parasitic capacitance may decrease. Accordingly, the response time of the semiconductor memory device may be shortened.

The spacers 131 may contact the sidewalls of the bit line structures BL. In an example, the first spacer 131 may extend to the sidewalls of the bit line contact pattern DC and may be disposed on the interlayer insulating layer 110.

Also, the spacer 131 may surround the lower portion of the landing pad 155. That is, the spacer 131 may have a ring shape from a plan view, and may be positioned below the upper portion of the landing pad 155. That is, the spacer 131 may overlap the lower portion of the landing pad 155 from a plan view.

According to embodiments, a pad insulation pattern LPI may be filled between the upper portions of the landing pads LP. The pad insulation pattern LPI may have a rounded lower surface. The upper surface of the pad insulating pattern LPI may be coplanar with the upper surfaces of the landing pads LP.

The pad insulating pattern LPI may include a first capping insulating layer 161 and a second capping insulating layer 163 sequentially stacked. The first capping insulating layer 161 may have a substantially uniform thickness, and the second capping insulating layer 163 may be filled between the landing pads LP. The first capping insulating layer 161 may directly contact the landing pads LP and the hard mask patterns 125 of the bit line structures BL. In addition, the first capping insulating layer 161 may cover the upper surfaces of the insulating patterns 143 and may directly contact a part of the spacer 131. The first and second capping insulating layers 161 and 163 may include a silicon oxide layer, a silicon nitride layer, and/or a silicon oxynitride layer.

According to embodiments, the data storage patterns DSP may be disposed on the contact pad structures CPS, respectively. The data storage patterns DSP may be electrically connected to the second impurity regions 1b, respectively, through the contact pad structures CPS. The data storage patterns DSP may be respectively disposed to deviate from the landing pads LP of the contact pad structures CPS, and may respectively contact parts of the landing pads LP. In an example, the data storage patterns DSP may be arranged in a honeycomb or zigzag shape from a plan view.

According to an example, the data storage patterns DSP may be capacitors, and may include lower and upper electrodes and a dielectric layer interposed between the lower and upper electrodes. Alternatively, the data storage patterns DSP may be variable resistance patterns that may be switched to two resistance states by an electric pulse applied to a memory element. For example, the data storage patterns DSP may include phase-change materials whose crystal state changes according to the amount of current, perovskite compounds, transition metal oxides, magnetic materials, ferromagnetic materials, or antiferromagnetic materials.

FIGS. 25A to 25F are diagrams illustrating a semiconductor memory device according to another embodiment. When comparing FIGS. 24A and 25A, a spacer 131a of the semiconductor memory device of FIG. 25A may be disposed on a part of sidewalls of the bit line structures BL. For example, the spacer 131 overlaps the polysilicon pattern 121, the barrier/liner pattern 122, and the metal pattern 123 with respect to a first direction, but may not overlap the hard mask pattern 125. Because the hard mask pattern 125 itself has an insulating characteristic, the spacer 131 may not be disposed on the hard mask pattern 125.

Figure 25A:
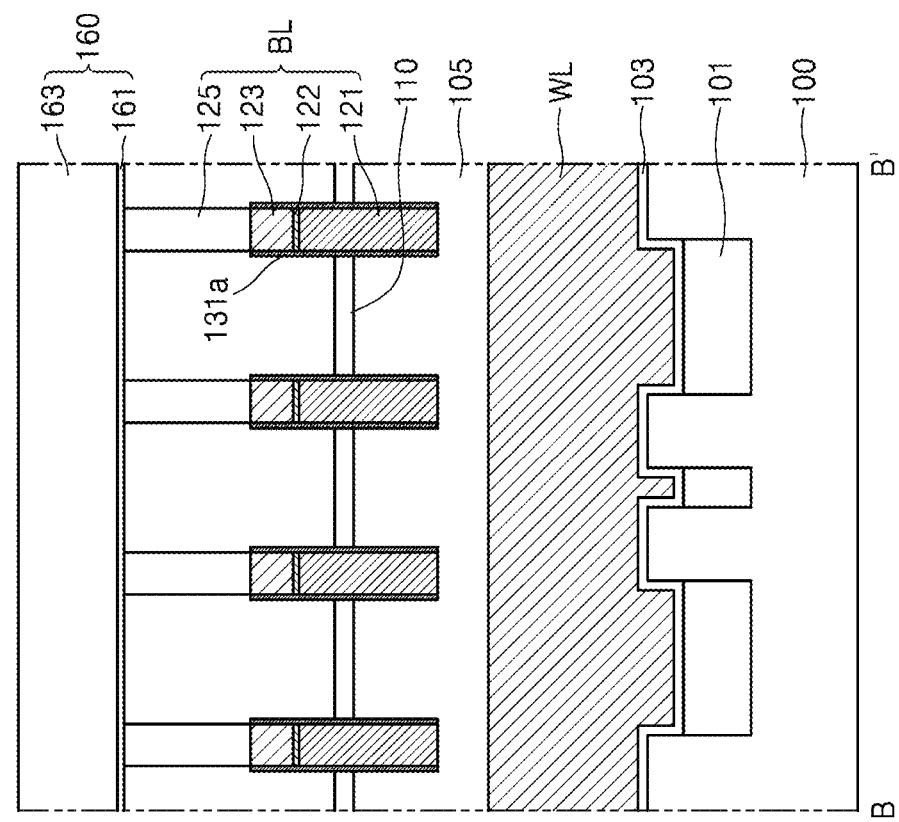
FIGS. 25A to 25F are diagrams illustrating a semiconductor memory device according to another embodiment.
Figure 25A:
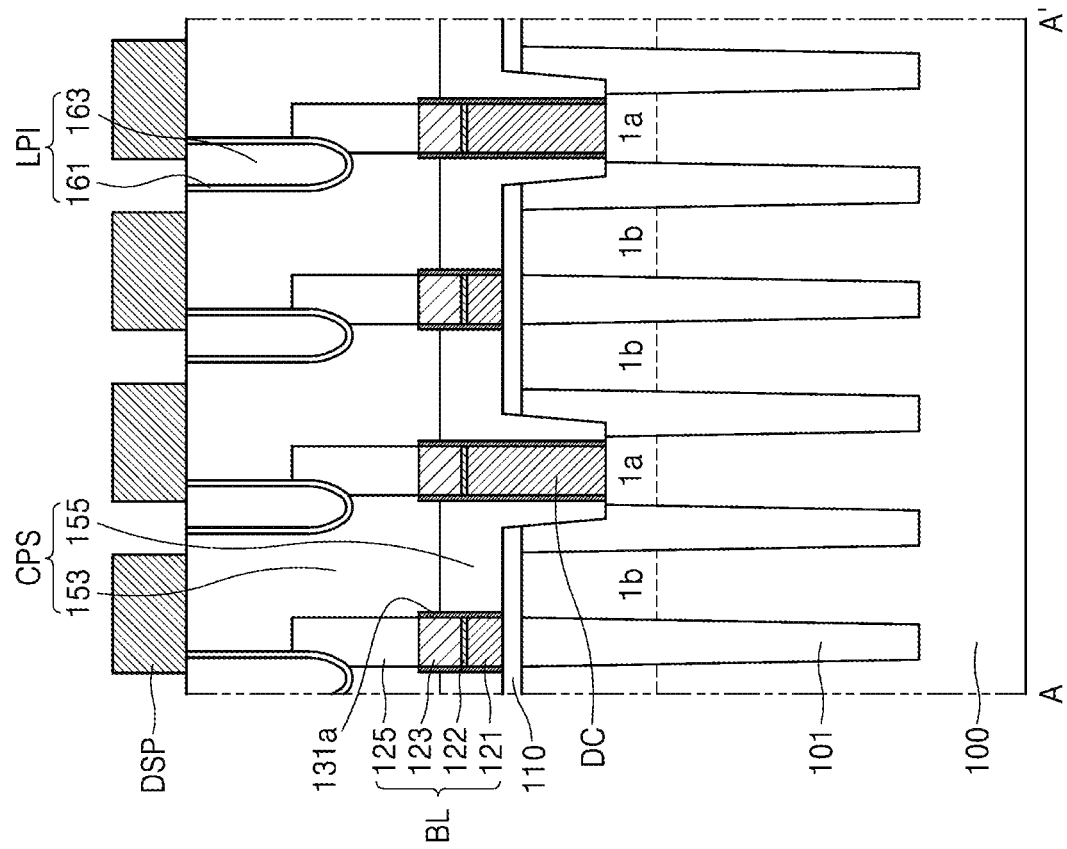
Figure 25B:
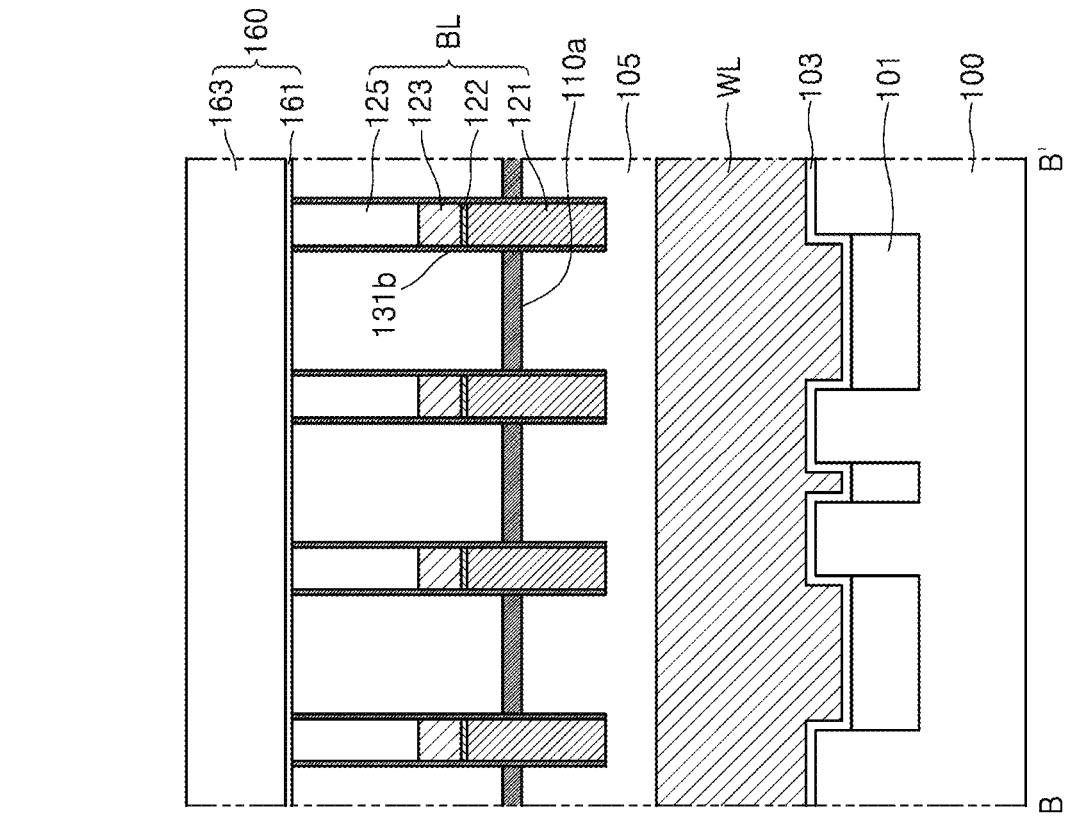
Figure 25B:
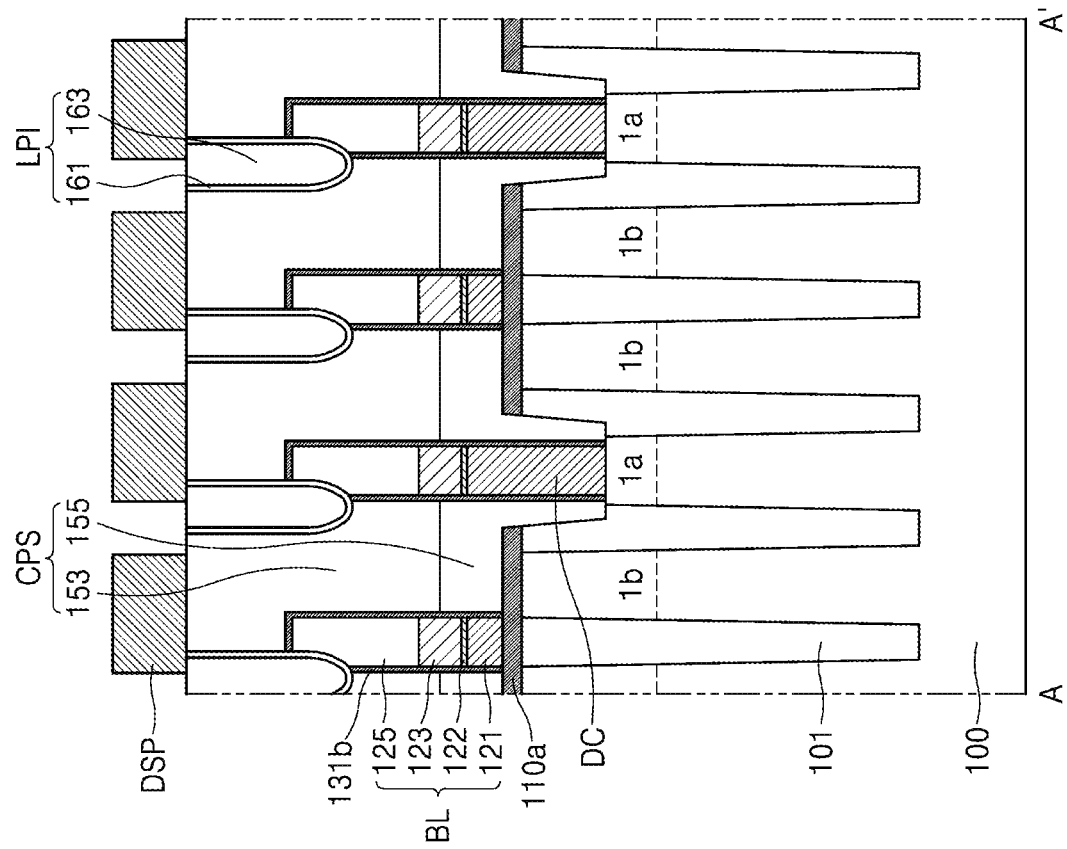

As shown in FIG. 25B, an interlayer insulating layer 110a of the semiconductor memory device may include a boron nitride layer according to an embodiment. For example, the interlayer insulating layer 110a may include at least one of an amorphous boron nitride layer and a nanocrystalline boron nitride layer. The boron nitride layer according to an embodiment is chemically stable, thereby limiting and/or preventing diffusion of material between the polysilicon pattern 121 and the semiconductor substrate 100. The boron nitride layer according to an embodiment is described above, and thus a detailed description thereof will be omitted.

When the interlayer insulating layer 110a includes the boron nitride layer according to an embodiment, a spacer 131b may or may not include the boron nitride layer according to an embodiment. For example, the spacer 131b may be formed of a dielectric material of a low dielectric constant without including the boron nitride layer according to an embodiment.

Figure 25C:
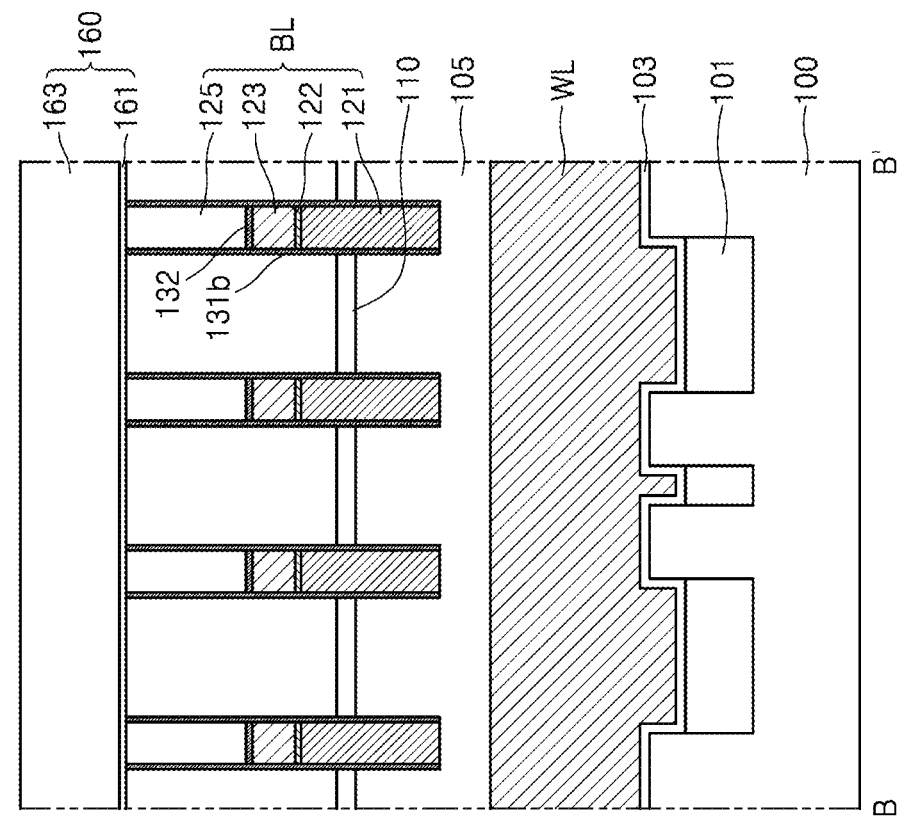
Figure 25C:
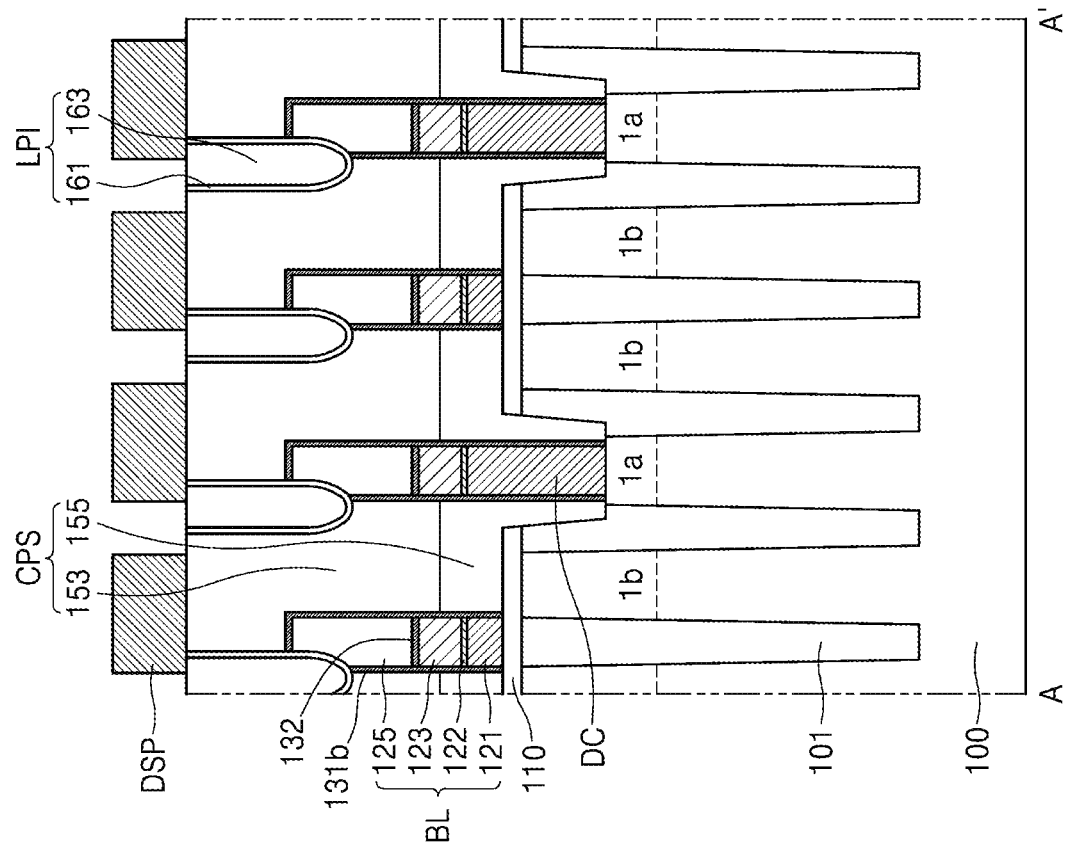

Alternatively, as illustrated in FIG. 25C, in the semiconductor memory device, a capping layer 132 may be further disposed between the metal pattern 123 and the hard mask pattern 125 of the bit line structures BL. The capping layer 132 may limit and/or prevent a metal material of the metal pattern 123 from diffusing to the hard mask pattern 125. The capping layer 132 may include the boron nitride layer according to an embodiment. For example, the capping layer 132 may include at least one of an amorphous boron nitride layer and a nanocrystalline boron nitride layer. The amorphous boron nitride layer and the nanocrystalline boron nitride layer are chemically stable, thereby limiting and/or preventing the metal material of the metal pattern 123 from diffusing to the outside.

The capping layer 132 may further include other materials in addition to the boron nitride layer according to an embodiment. For example, the capping layer 132 may include at least one of magnesium (Mg), aluminum (Al), scandium (Sc), vanadium (V), chromium (Cr), manganese (Mn), nickel (Ni), copper (Cu), Zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), iridium (Ir), platinum (Pt), gold (Au), bismuth (Bi), ruthenium (Ru), and may include nitride or oxide including at least one of titanium (Ti), tantalum (Ta), tungsten (W), and cobalt (Co).

Figure 25D:
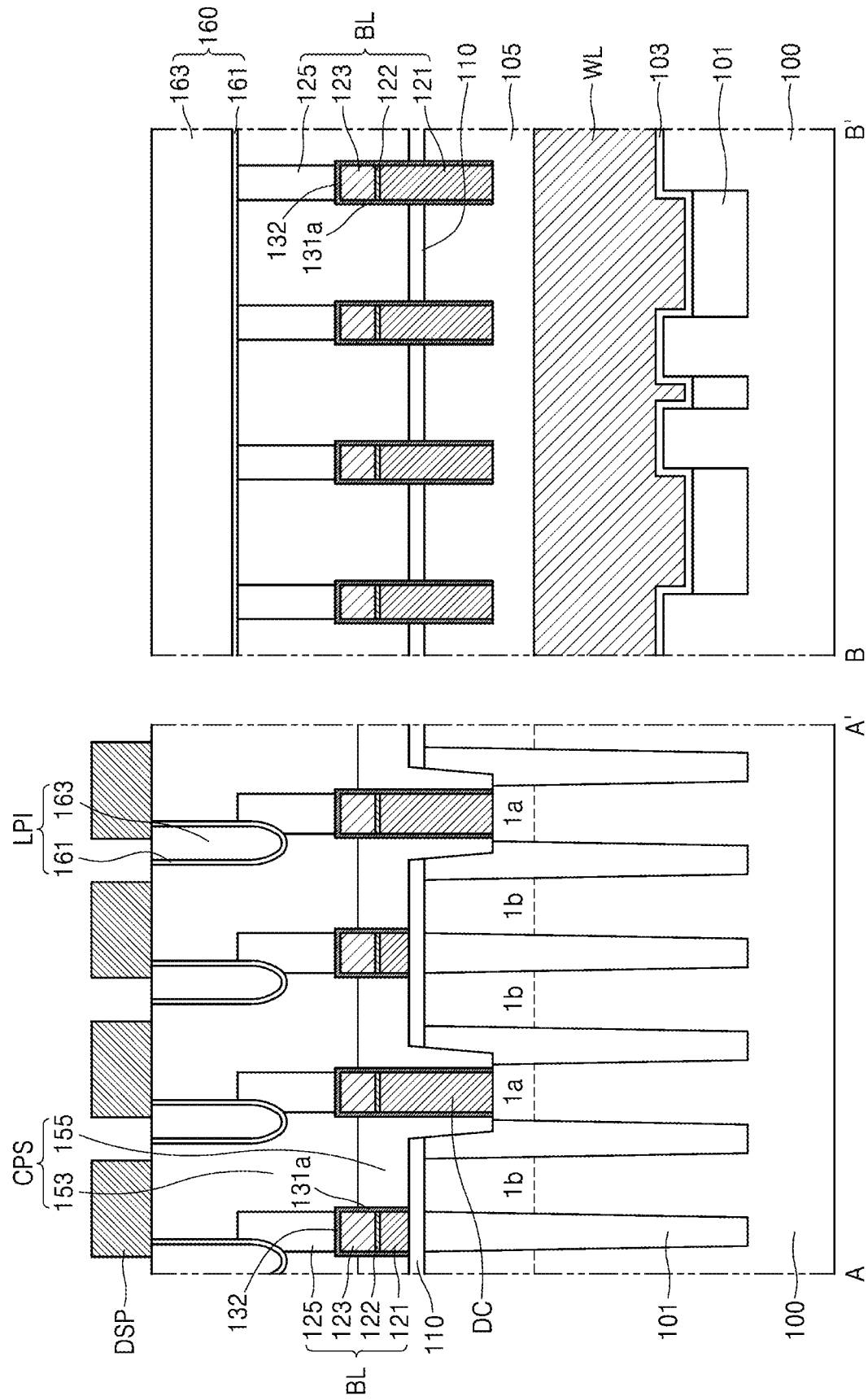

Alternatively, as shown in FIG. 25D, the semiconductor memory device may include the spacer 131a including the boron nitride layer according to an embodiment and the capping layer 132 including the boron nitride layer according to an embodiment. The edge of the capping layer 132 may contact the spacer 131a. When the spacer 131a and the capping layer 132 form the boron nitride layer according to an embodiment, the spacer 131a and the capping layer 132 may be formed in a single mask process, thereby simplifying a process.

Figure 25E:
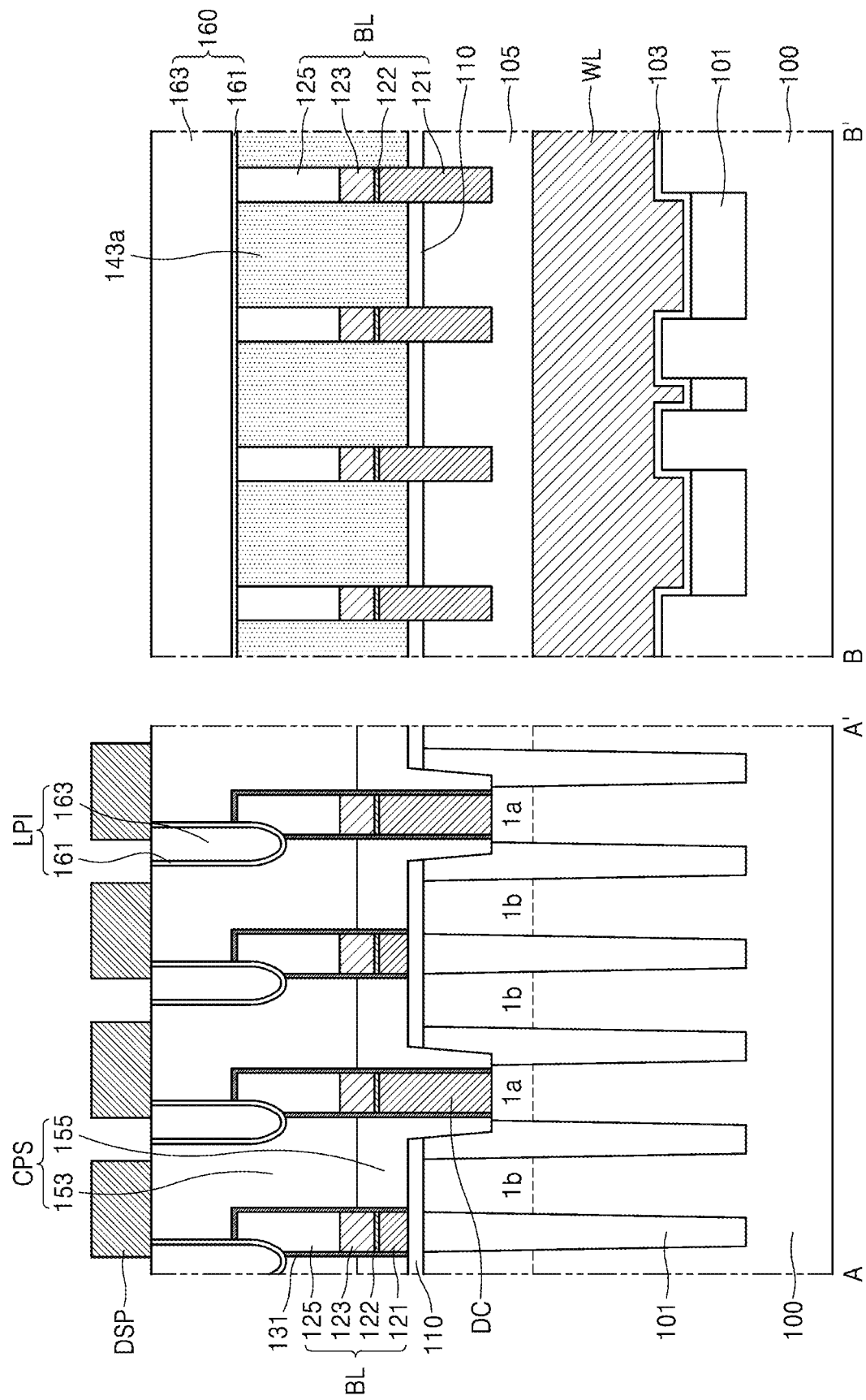

As illustrated in FIG. 25E, an insulating pattern 143a of the semiconductor memory device may include the boron nitride layer according to an embodiment. When the insulating pattern 143a includes the boron nitride layer according to an embodiment, the material included in the bit line structures BL may be limited and/or prevented from diffusing to the outside as well as parasitic capacitance between conductive materials may be reduced. In addition, separate spacers are not provided on the sidewalls of the bit line structures BL in contact with the insulating pattern 143a, and thus the process may be simplified.

Figure 25F:
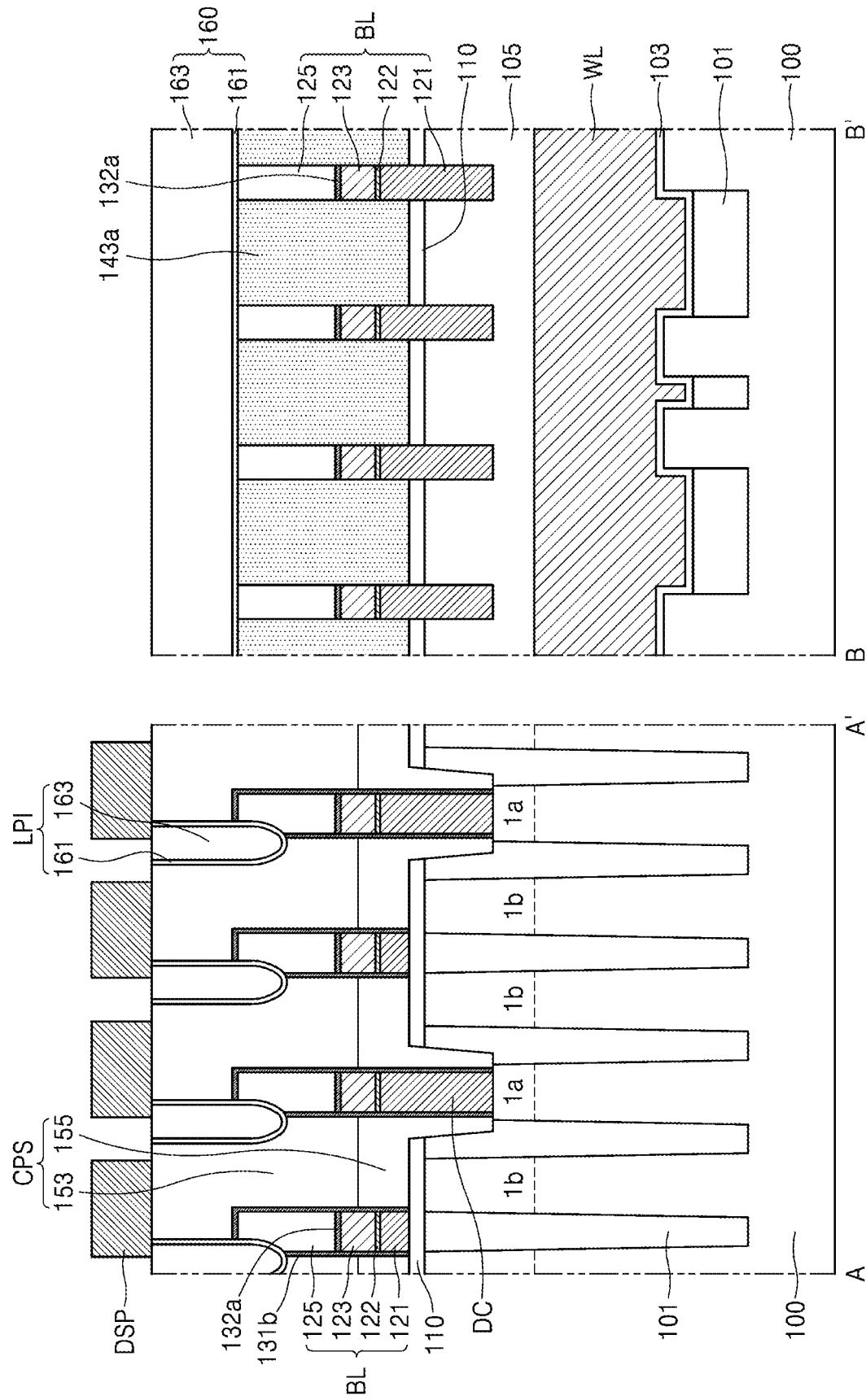

Alternatively, as shown in FIG. 25F, the semiconductor memory device may include the insulating pattern 143a including the boron nitride layer according to an embodiment and the capping layer 132 including the boron nitride layer according to an embodiment. The insulating pattern 143a may further include an insulating material in addition to the boron nitride layer according to an embodiment, and the capping layer 132 may further include a metal material in addition to the boron nitride layer according to an embodiment.

As described above, because the boron nitride layer according to an embodiment is stable, the boron nitride layer may be used as a capping layer, that is, a diffusion barrier layer in a semiconductor memory device, and may be used as an interlayer insulating material layer because the boron nitride layer has a low dielectric constant. In addition, the boron nitride layer according to an embodiment may be used as a spacer to reduce parasitic capacitance between conductive materials.

The semiconductor memory devices described above may be implemented in various types of semiconductor packages. For example, the semiconductor memory devices according to embodiments of the present disclosure may be packaged in Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), etc. The package in which the semiconductor memory device according to embodiments of the present disclosure is mounted may further include a controller controlling the semiconductor memory device and/or a logic device.

Figure 26:
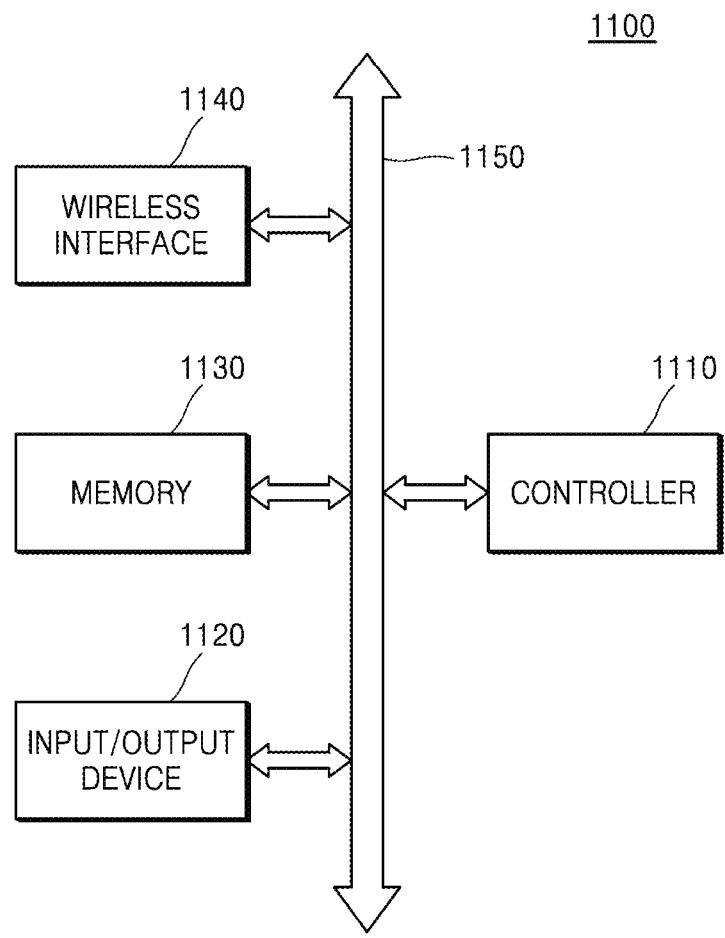
FIG. 26 is a block diagram schematically illustrating an electronic device including a semiconductor memory device according to an embodiment.

FIG. 26 is a block diagram schematically illustrating an electronic device 1100 including a semiconductor memory device according to an embodiment.

Referring to FIG. 26, the electronic device 1100 according to an embodiment may be a PDA, a laptop computer, a portable computer, a display device, a web tablet, a wireless telephone, a mobile phone, a digital music player, and a wired or wireless electronic device or one of a composite electronic device including at least two of these. The electronic device 1100 may include a controller 1110, an input/output device 1120 such as a keypad, a keyboard, and a display, a memory 1130, and a wireless interface 1140 coupled to each other through a bus 1150. The controller 1110 may include, for example, one or more microprocessors, digital signal processors, microcontrollers, or similar ones. The memory 1130 may be used, for example, to store instructions executed by the controller 1110. The memory 1130 may be used to store user data. The memory 1130 may include at least one of semiconductor memory devices according to embodiments of the present disclosure. The electronic device 1300 may use the wireless interface 1140 to transmit data to a wireless communication network that communicates with an RF signal or to receive data from the network. For example, the wireless interface 1140 may include an antenna, a wireless transceiver, etc. The electronic device 1100 may be used in a communication interface protocol such as a third generation communication system such as CDMA, GSM, NADC, E-TDMA, WCDAM, and CDMA2000.

Figure 27:
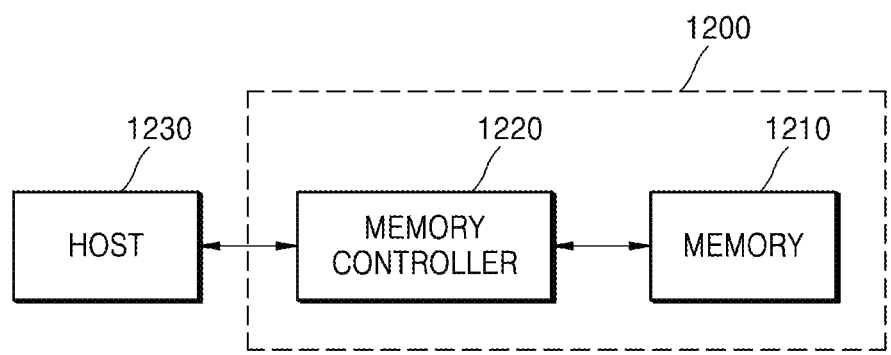
FIG. 27 is a block diagram schematically illustrating a memory system including a semiconductor memory device according to an embodiment.

FIG. 27 is a block diagram schematically illustrating a memory system 1200 including a semiconductor memory device according to an embodiment.

Referring to FIG. 27, semiconductor memory devices according to an embodiment may be used to implement a memory system. The memory system 1200 may include a memory 1210 for storing a large amount of data and a memory controller 1220. The memory controller 1220 controls the memory device 1210 to read or write data stored from the memory device 1210 in response to a read/write request from the host 1230, thereby transforming the memory controller 1210 into a special-purpose controller configured to control the memory device 1210. The memory controller 1220 may configure an address mapping table for mapping an address provided from a host 1230, for example, a mobile device or a computer system to a physical address of the memory device 1210. The memory 1210 may include at least one of the semiconductor memory devices according to an embodiment of the present disclosure.

The controller 1110 in FIG. 26 and memory controller 1220 in FIG. 27 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The controller 1110 in FIG. 26 may operate in response to receiving commands through the wireless interface 1140 and/or the input/output device 1120, and/or instructions stored in the memory 1130, thereby transferring the controller 1110 into a special-purpose controller 1110 configured to control the operations of the electronic device including a memory 1130 that may include at least one of semiconductor memory devices according to embodiments of the present disclosure.

In the above, although the embodiment of a boron nitride layer of a low dielectric constant has been illustrated and described above, the present disclosure is not limited to the specific embodiments described above, and does not depart from the gist of the present disclosure as claimed in the claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor memory device comprising:
a semiconductor substrate;
word lines extending in a first direction on the semiconductor substrate;
bit line structures extending across the word lines, the bit line structures extending in a second direction crossing the first direction;
contact pad structures between the word lines and between the bit line structures; and
spacers between the bit line structures and the contact pad structures, the spacers comprising a boron nitride layer contacting sidewalls of the bit line structures and extending a length of the sidewalls of the bit line structure, and wherein the spacers extend along an upper surface of the bit line structures between, and in direct contact with the bit line structures and at least part of the contact pad structures.

2. The semiconductor memory device of claim 1, wherein the spacers surround at least a part of the contact pad structures.

3. The semiconductor memory device of claim 1, wherein the bit line structures comprise a polysilicon pattern, a barrier/liner pattern, a metal pattern, and a hard mask pattern, which are sequentially stacked on the semiconductor substrate, and
the spacers overlap the polysilicon pattern, the barrier/liner pattern, and the metal pattern with respect to the first direction.

4. The semiconductor memory device of claim 3, wherein the spacers are in direct contact with at least one of the polysilicon pattern, the barrier/liner pattern, and the metal pattern.

5. The semiconductor memory device of claim 3, wherein the spacers are configured to overlap at least a part of the hard mask pattern with respect to the first direction.

6. The semiconductor memory device of claim 1, wherein the boron nitride layer has a dielectric constant of 2.5 or less at an operating frequency of 100 kHz.

7. The semiconductor memory device of claim 1, wherein the boron nitride layer comprises at least one of amorphous material and nanocrystalline material.

8. The semiconductor memory device of claim 1, wherein the boron nitride layer is non-porous.

9. The semiconductor memory device of claim 1, further comprising:
capping layers, wherein the bit line structures comprise a polysilicon pattern, a barrier/liner pattern, a metal pattern, and a hard mask pattern, which are sequentially stacked on the semiconductor substrate, and
the capping layers are between the metal pattern and the hard mask pattern.

10. The semiconductor memory device of claim 9, wherein the capping layers comprise a boron nitride layer.

11. The semiconductor memory device of claim 10, wherein the boron nitride layer included in the capping layers has the same physical properties as those of the boron nitride layer included in the spacers.

12. The semiconductor memory device of claim 9, wherein end portions of the capping layers are in contact with the spacers.

13. The semiconductor memory device of claim 1, further comprising:
- a gate hard mask pattern on the word lines;
- an interlayer insulating layer on the gate hard mask pattern; and
- an insulating pattern on the interlayer insulating layer, wherein
- at least one of the interlayer insulating layer and the insulating pattern comprises a boron nitride layer.

14. The semiconductor memory device of claim 13, wherein the boron nitride layer included in the at least one of the interlayer insulating layer and the insulating pattern has the same physical properties as those of the boron nitride layer included in the spacers.

15. The semiconductor memory device of claim 13, wherein
- the insulating pattern comprises the boron nitride layer, and
- the insulating pattern and the spacers are integrated with each other.

16. The semiconductor memory device of claim 13, wherein the interlayer insulating layer contacts the spacers.

17. A device comprising:
- a memory comprising the semiconductor memory device of claim 1; and
- a controller configured to at least one of store data in the memory or read data in the memory.

18. The device of claim 17, wherein the device is at least one of a computer, a portable electronic device, a display, or a memory system.

* * * * *

UNITED STATES PATENT AND TRADEMARK OFFICE
CERTIFICATE OF CORRECTION

PATENT NO. : 11,424,186 B2
APPLICATION NO. : 17/082530
DATED : August 23, 2022
INVENTOR(S) : Hyeonjin Shin et al.

Page 1 of 1

It is certified that error appears in the above-identified patent and that said Letters Patent is hereby corrected as shown below:

On the Title Page

At item (30), the foreign priority information should be added.
October 29, 2019 (KR) ............................... 10-2019-0135755

Signed and Sealed this
Twenty-sixth Day of November, 2024

Katherine Kelly Vidal
*Director of the United States Patent and Trademark Office*